(12) United States Patent
Nogiwa et al.

(10) Patent No.: US 7,517,419 B2
(45) Date of Patent: Apr. 14, 2009

(54) SUBSTRATE SUPPORT JIG, CIRCUIT BOARD PRODUCTION APPARATUS, AND METHOD OF PRODUCING CIRCUIT BOARD

(75) Inventors: Tatsuki Nogiwa, Yawata (JP); Mitsuhiro Ikeda, Kobe (JP); Hiroshi Yamauchi, Katano (JP); Mineo Tokunaga, Kagoshima-ken (JP)

(73) Assignee: Panasonic Corporation, Osaka (JP)

( * ) Notice: Subject to any disclaimer, the term of this patent is extended or adjusted under 35 U.S.C. 154(b) by 347 days.

(21) Appl. No.: 10/825,335

(22) Filed: Apr. 16, 2004

(65) Prior Publication Data
US 2005/0230050 A1    Oct. 20, 2005

(51) Int. Cl.
*B32B 37/20* (2006.01)
(52) U.S. Cl. .............. 156/152; 156/297; 156/299; 156/344; 269/21
(58) Field of Classification Search .......... 156/152, 156/297, 299, 344, 584; 269/21
See application file for complete search history.

(56) References Cited

FOREIGN PATENT DOCUMENTS

| JP | 1-198094 | 8/1989 |
|---|---|---|
| JP | 4-342196 | 11/1992 |
| JP | 2000-261193 | 9/2000 |
| JP | 2001-144430 | 5/2001 |
| JP | 2001-210998 | 8/2001 |
| JP | 2002-232197 | 8/2002 |
| JP | 2002-374062 | 12/2002 |
| JP | 2002-142897 | * 5/2003 |

OTHER PUBLICATIONS

Machine Translation of 2002-142897 (cited above) from PAJ database.*
Machine Translation of 2001-144430 (Submitted in IDS) from PAJ database.*

* cited by examiner

*Primary Examiner*—George R Koch, III
(74) *Attorney, Agent, or Firm*—Wenderoth, Lind & Ponack, L.L.P.

(57) ABSTRACT

A substrate support jig, for removably holding a substrate when mounting electronic components on the substrate, includes a base member having a first surface and a second surface facing and substantially parallel to each other; and an adhesive layer with a predetermined shape and a predetermined thickness formed on the first surface side by applying an adhesive material with a predetermined unit tackiness to an adhesive region. In the adhesive region is formed a land section such that a surface of the land section protrudes from a surface of the adhesive layer by a predetermined amount. The tackiness between the adhesive material and the base member is lower than the tackiness between the adhesive material and the substrate.

26 Claims, 16 Drawing Sheets

SUBSTRATE SUPPORT JIG, CIRCUIT BOARD PRODUCTION APPARATUS, AND METHOD OF PRODUCING CIRCUIT BOARD

BACKGROUND OF THE INVENTION

1. Field of the Invention

The present invention relates to a substrate support jig for supporting a film-like, flexible substrate, for example, during the operation of mounting electronic components on a substrate; a circuit board production apparatus for mounting and bonding electronic components to a substrate with the substrate being supported by the substrate support jig, whereby the substrate is produced as a circuit board; and a method of producing a circuit board.

2. Description of the Background Art

In recent years, sheet-like flexible substrates have been used in electronic devices, such as mobile phones, in response to the demand for smaller, lighter electronic devices. The flexible substrate is comprised of a resin sheet having printed wiring provided thereon. A plurality of wiring patterns are formed on a flexible substrate, and electronic components, such as ICs, capacitors, resistors, coils, and connectors, are mounted on the wiring patterns, whereby a flexible circuit board is configured. The flexible circuit board is then mounted in a device.

The flexible circuit board has features in that it allows for reduction of substrate thickness and weight, and it can be bended or folded and therefore conforms well to complex shapes. Thus, the moving part of an electronic device does not require a custom joint as is required for non-flexible substrates, enabling a reduction in size of the device.

In particular, even resin sheets with a thickness of the order of 10 μm can be applied, and also flexible substrates composed of a copper foil and having a thickness of the order of 30 microns inclusive of wiring patterns are in actual use.

General mounting equipment is designed to carry substrates composed of materials such as phenolic paper, glass epoxy resin, and ceramic and typically having a side length of 10 mm or greater and a thickness of 0.1 to 4 mm, with both sides of the substrate being supported by belts. Such mounting equipment, however, have difficulty carrying a flexible substrate alone because of the low stiffness of the flexible substrate.

Therefore, conventionally, as shown in FIG. 16, a flexible substrate 43 is fixed to a metal plate 41 which is thick and has high stiffness, with holding clamps 42, for example, and then the metal plate 41 is supplied to special equipment which is a modified form of a carrying system of general mounting equipment. Subsequently, on the flexible substrate 43, cream solder 44 is printed and electronic components 45 are mounted, and then reflow is performed on the cream solder 44, whereby the electronic components 45 are mounted.

However, the workability of the process of fixing flexible substrates 43 to metal plates 41 piece by piece is poor. In addition, since the holding clamps 42 protrude from the top surface of the flexible substrate 43, a special screen is required in the process of screen-printing the cream solder 44. Further, since a plurality of portions of the flexible substrate 43 are held by the holding clamps 42, as shown in FIG. 17, the flatness of the flexible substrate 43 is poor, lowering the closeness of contact with the screen. This degrades the printing quality of the cream solder 44 and causes misposition of the printing or deformation of the cream solder 44, making it impossible to stably perform high-quality mounting.

Moreover, in order to mount a plurality of flexible substrates while ensuring high position accuracy, a plurality of holding clamps become necessary, which complicates the mounting operation as it needs to be done to avoid the misalignment of the substrate position. In addition, since metal plates are being used, special equipment is required as mounting equipment, leading to an increase in production costs.

SUMMARY OF THE INVENTION

In view of the foregoing problems, it is an object of the present invention to provide a substrate support jig, a circuit board production apparatus, and a method of producing a circuit board. With the substrate support jig, the operations of mounting and bonding of electronic components to a substrate can be performed stably, and also the substrate having the electronic components bonded thereto can be removed without degrading the quality of the substrate. In the circuit board production apparatus, the mounting and bonding of electronic components to a substrate are performed while the substrate is being supported by the substrate support jig, whereby the substrate is produced as a component-mounted circuit board.

The present invention has the following features to attain the object mentioned above. The present invention is directed to a substrate support jig for removably holding a substrate when mounting electronic components on the substrate, comprising: a base member having a first surface and a second surface, the first surface and the second surface facing and substantially parallel to each other; and an adhesive region having an adhesive layer with a predetermined shape and a predetermined thickness formed on a side of the first surface, the adhesive layer being formed by applying an adhesive material with a predetermined unit tackiness, wherein a land section is formed in the adhesive region such that a surface of the land section protrudes from a surface of the adhesive layer by a predetermined amount, and tackiness between the adhesive material and the base member is lower than tackiness between the adhesive material and the substrate.

In addition, the present invention is directed to a circuit board production apparatus for producing an electronic circuit board by mounting electronic components on a substrate, the apparatus comprising: an adhesion apparatus for pressing the substrate against a substrate support jig for temporary adhesion; a bonding-material supply apparatus for applying a bonding material for bonding the electronic components to the temporarily adhered substrate; a component mounting apparatus for mounting the electronic components to the applied bonding material; a heating apparatus for heating the bonding material having the electronic components mounted thereto, to bond the electronic components to the substrate; and a substrate removing apparatus for peeling the substrate having the electronic components bonded thereto off the substrate support jig, wherein the substrate support jig includes: a base member having a first surface and a second surface, the first surface and the second surface facing and substantially parallel to each other; and an adhesive region having an adhesive layer with a predetermined shape and a predetermined thickness formed on a side of the first surface, the adhesive layer being formed by applying an adhesive material with a predetermined unit tackiness, wherein a land section is formed in the adhesive region such that a surface of the land section protrudes from a surface of the adhesive layer by a predetermined amount, and tackiness between the adhesive material and the base member is lower than tackiness between the adhesive material and the substrate.

The substrate support jig of the present invention described above may have through holes which are provided in the adhesive region having the adhesive material and which are used to peel the substrate temporarily adhered to the adhesive material. Thus, the mounting and bonding of electronic components to the substrate can be performed stably while the substrate being temporarily adhered to the adhesive region is supported by the substrate support jig. Further, the substrate having electronic components bonded there to can be reliably peeled off the base member of the substrate support jig without causing the substrate to curl or causing any damage (e.g., breaks) to the substrate.

In addition, by providing through holes in a non-filling section where the adhesive material is not provided, it is possible to prevent causing damage to the adhesive material. By forming the adhesive region in an area corresponding to a part of a non-lead section of the substrate, curling of a lead section which may occur when peeling the substrate can be more reliably prevented, and thus it is possible to prevent the substrate itself from becoming unusable.

Since the adhesive material has a predetermined hardness, moderate adhesiveness can be provided to the substrate, facilitating the mounting of electronic components on the substrate. Further, since the adhesive material has a heat resistance that withstands temperatures exceeding the heating temperature of a bonding material, the degradation of the adhesive material due to the heat applied during the bonding of electronic components using the bonding material does not occur.

Since the adhesive material has abrasion resistance, the cleaning operation of the adhesive material does not cause the adhesive material to peel off the substrate support jig or the adhesiveness of the substrate to degrade.

Positioning marks are provided on the base member of the substrate support jig, which makes it possible to perform positioning of the substrate support jig with high accuracy when allowing a substrate to temporarily adhere to the substrate support jig or when providing a bonding material to a substrate, for example.

The circuit board production apparatus according to the present invention includes an adhesion apparatus, a component mounting apparatus, a heating apparatus, and a substrate removing apparatus, in which a substrate is held onto a substrate support jig such that the entire back side of the substrate is peelably adhered onto the substrate support jig. Thus, the substrate can be supported by the substrate support jig while ensuring the flatness of the substrate. In addition, since a substrate and a substrate support jig are integrated, the substrate can be treated in the same manner as conventional circuit boards with no flexibility, and electronic components can be mounted and bonded to the substrate.

The mounting and bonding of electronic components to a substrate can be performed using existing equipment, and therefore stable, high-quality component mounting can be performed efficiently and at low cost. Further, it is possible to employ a cyclic process in which after the substrate having electronic components bonded thereto has been removed from a substrate support jig, the substrate support jig is reused for temporary adhering of another substrate. This makes it possible to automate the supply/removal of a substrate to/from a substrate support jig.

By providing a recognition apparatus to the adhesion apparatus, automatic mounting/removal of a substrate on/from a substrate support jig can be performed through collaboration with the substrate removing apparatus. In addition, by providing a cleaning apparatus, foreign matter can be removed from a substrate support jig, whereby the adhesive effect of an adhesive material in an adhesive region of the substrate support jig can be maintained.

These and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
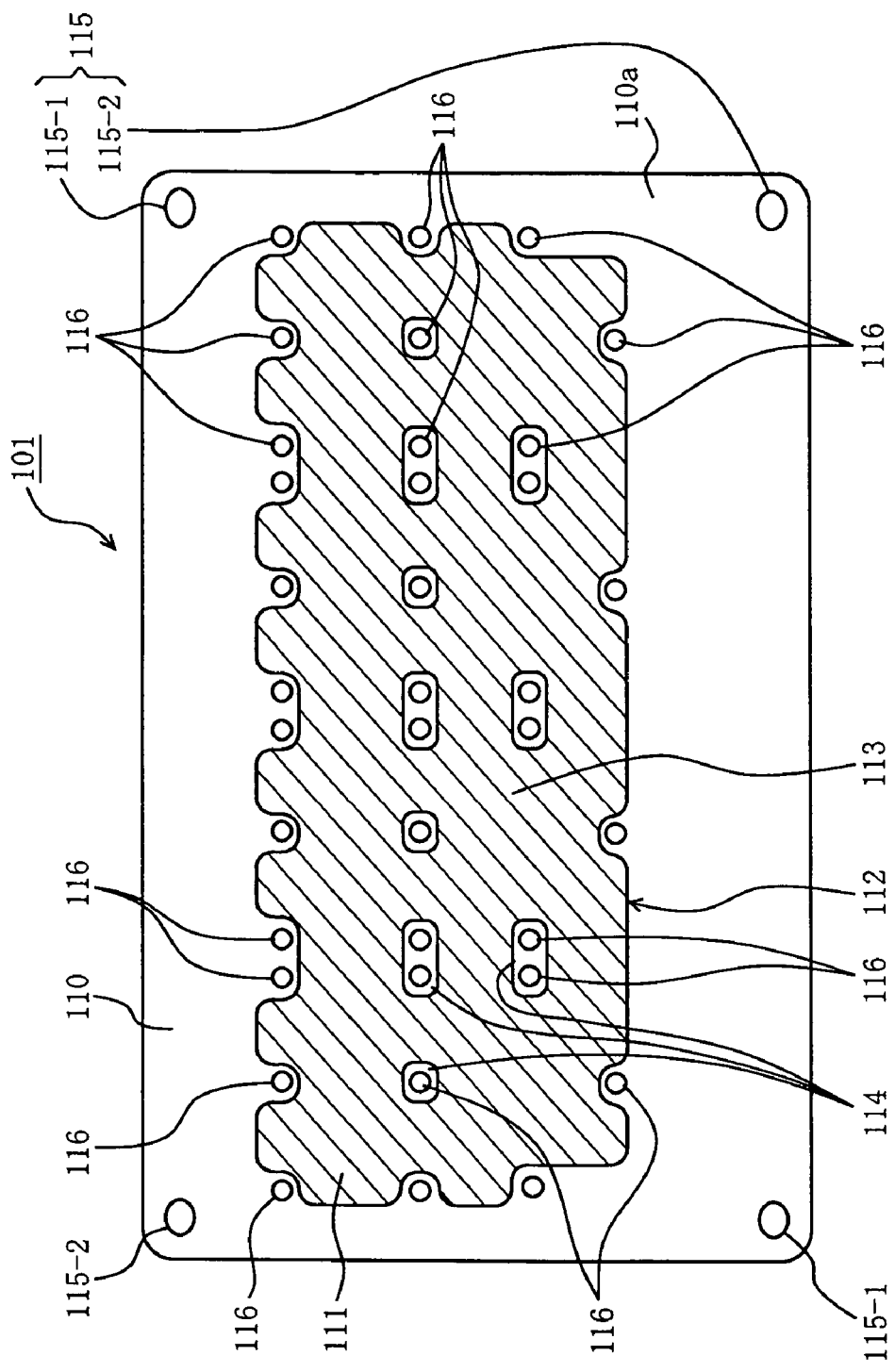
FIG. 1 is a plan view illustrating a substrate support jig according to an embodiment of the present invention.

With reference to the drawings, a substrate support jig, a circuit board production apparatus, and a method of producing a circuit board, according to an embodiment of the present invention are described below. The circuit board production apparatus performs mounting and bonding of electronic components on a substrate while the substrate is being supported by a substrate support jig, whereby the substrate is produced as a component-mounted circuit board. The method of producing a circuit board is carried out by the circuit board production apparatus. Note that like components are designated by the same reference numerals throughout the figures.

Figure 3:
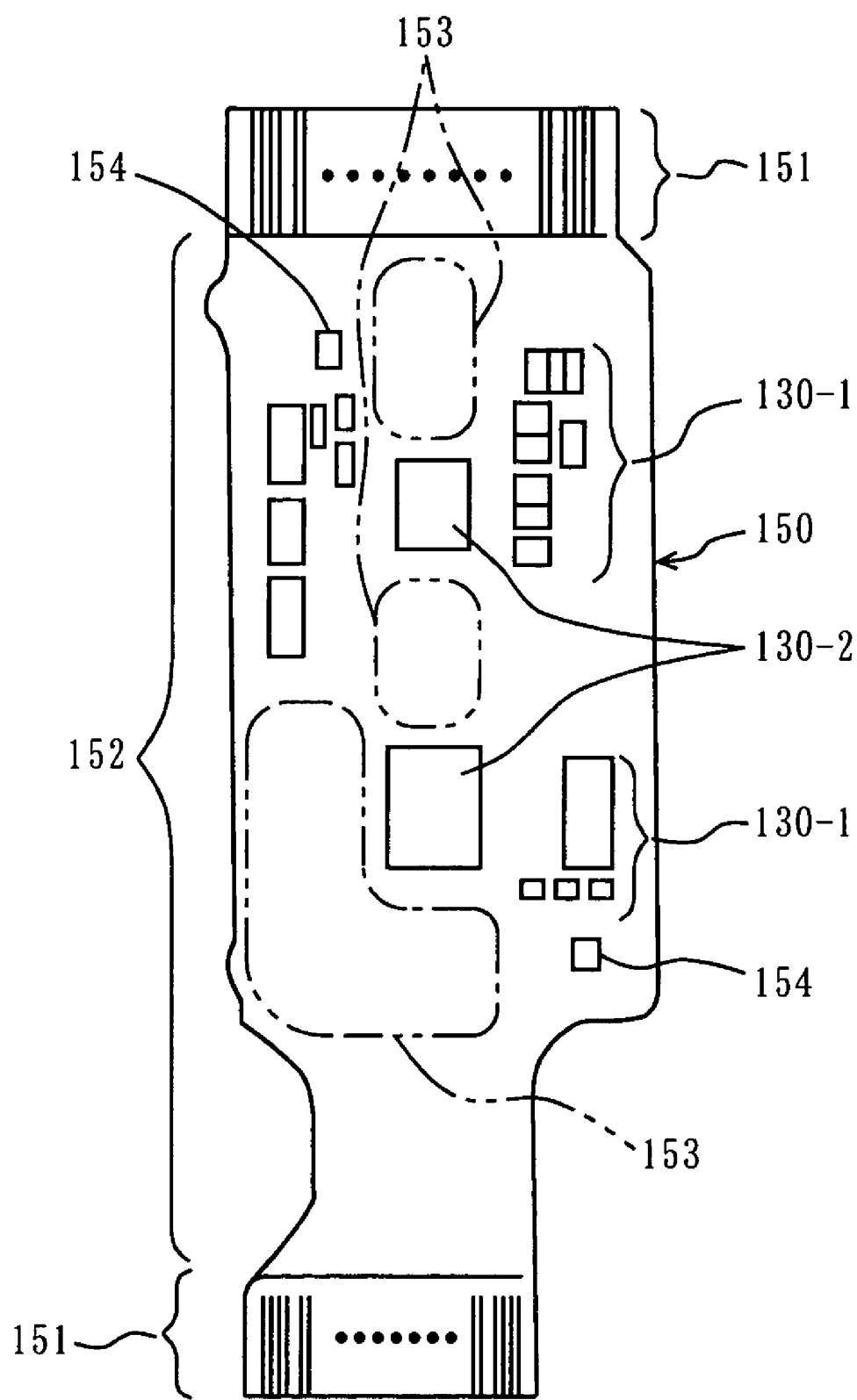
FIG. 3 is a plan view illustrating a flexible printed board.

In the present embodiment, as an exemplary substrate, a flexible printed circuit board (FPC) is used which is a flexible, film-like substrate composed of a resin material and has printed wiring provided thereon and a shape such as the one shown in FIG. 3, for example. The size of a rectangular, sheet-like FPC 150, as shown in FIG. 3, is about 30 mm in width and about 70 mm in length, for example. As substrates to be supported by the substrate support jig, particularly, substrates that may be difficult to carry alone because of their low stiffness are regarded as appropriate examples; however, the substrates to be supported are not limited to FPCs or substrates which are difficult to carry. As shown in FIG. 3, in the present embodiment, electronic components 130 are mounted on only one side of an FPC 150.

FIG. 1 illustrates an exemplary flexible-substrate support jig 101 which serves as the aforementioned substrate support jig. The flexible-substrate support jig 101 is a plate-like jig including: a base member 110; and an adhesive material 111 for allowing an FPC 150 to peelably and temporarily adhere thereto, provided on a placement side 110a of the base member 110, in which the FPC 150 is temporarily adhered to the adhesive material 111, thereby supporting the FPC 150 on the base member 110.

The expression "temporarily adhere" means that the FPC 150 having been adhered to the adhesive material 111 can be removed from the adhesive material 111. As the base member 110, in order to efficiently conduct the heat generated by a heating operation, as will be described later, to the FPC 150 and to efficiently dissipate the heat while cooling, it is preferable to use alloys of aluminum or magnesium having a high thermal conductivity. The thickness of the base member 110 is preferably on the order of 2 to 4 mm in view of heat conduction during the heat operation, as will be described later, and mechanical strength.

The flexible-substrate support jig 101 further includes through holes 116 provided in an adhesive region 112 having the adhesive material 111 so as to penetrate through the base member 110, and used to peel the temporarily adhered FPC 150 off the base member 110. Note that although in FIGS. 1 and 2 the adhesive region 112 is hatched, the hatching is not intended to indicate a cross section, but is intended to indicate the area where the adhesive material 111 is present. In addition, although in the present embodiment the through holes 116 are in a circular shape, the shape is not limited thereto; for example, the through holes 116 may be in a rectangular shape.

The adhesive region 112 has a filling section 113 where the adhesive material 111 is provided, and a non-filling section 114 where the adhesive material 111 is not provided but the through holes 116 are provided. In the present embodiment, the adhesive region 112 of the adhesive material 111 is formed on the base member 110 as follows. Specifically, in the present embodiment, using a milling machine, the placement side 110a of the base member 110 is cut in a depression, thereby forming a filling section 113. The depth of the filling section 113 from the surface of the placement side 110a is related to the thickness of the adhesive material 111. The thickness of the adhesive material 111 is preferably thin, and most preferably on the order of 0.1 mm to 0.6 mm, in view of the closeness of contact between the FPC 150 and the adhesive material 111 and efficient heat conduction to the FPC 150 during heating of the flexible-substrate support jig 101, as will be described later.

Therefore, in the present embodiment, the depth of the filling section 113 is set to less than 1 mm, preferably in the neighborhood of 0.5 mm. Here, the non-filling section 114 is a portion that is not subjected to the cutting process. Thus, the non-filling section 114 protrudes from the filling section 113. In the filling section 113 formed in the above-described manner, an adhesive agent is provided and thereafter an adhesive material 111 is filled, heated, and pressurized for solidification. The filling section 113 thus formed has a flat adhesive surface for an FPC 150, enabling temporary adhesion of an FPC 150 without causing the FPC 150 to be peeled off the flexible-substrate support jig 101.

The adhesive material 111 is provided so as to protrude from the surface of the placement side 110a slightly (by about 0.1 mm in the present embodiment). At this point, since the non-filling section 114 protrudes from the filling section 113 and also the adhesive material 111 has surface tension, the adhesive material 111 cannot be provided in the non-filling section 114.

Thus, by forming the non-filling section 114 so as to protrude from the filling section 113, filling of the adhesive material 111 in the filling section 113 can be easily performed.

The adhesive material 111 protrudes from the surface of the placement side 110a and the non-filling section 114 by about 0.1 mm. By thus allowing the adhesive material 111 to protrude, when the adhesive material 111 is cleaned in a cleaning apparatus 260, as will be described later, it is possible to prevent the edge portion of the adhesive material 111 from being left unwiped, for example. In addition, since the FPC 150 does not come into direct contact with either the surface of the placement side 110a or the non-filling section 114, it is possible to prevent the FPC 150 from being easily peeled off the surface of the placement side As the adhesive material 111, materials with adhesiveness may be used which allow a flexible substrate such as an FPC 150 to peelably adhere thereto. In addition, in the present embodiment, since a flexible-substrate support jig 101 is heated with an FPC 150 being adhered thereto, as will be described later, the material requires heat resistance; moreover, since electronic components are mounted on an FPC 150 being adhered to a flexible-substrate support jig 101, the material requires sufficient hardness to mount the components. Specifically, materials with adhesiveness include silicone rubber and polyurethane rubber. Thus, if heat resistance is not required, polyurethane rubber may be used.

Heating acts on a bonding material for bonding electronic components mounted on an FPC 150 to the FPC 150. In the case where, for example, cream solder is used as the bonding material, by heating the cream solder is melted. Thus, the aforementioned heat resistance needs to be sufficient to withstand conditions in which the bonding material is subjected to the process. In the case where cream solder including lead-free solder is used as the bonding material, the heating temperature is about 230 C, and thus, specifically, a heat resistance to about 250 C, a few minutes may be sufficient. In the case where eutectic solder is used as the bonding material, on the basis that the melting point of eutectic solder is 183 C, a heat resistance to 185 C or higher may be sufficient.

Taking into account such heat resistance, silicone rubber may be optimally used as the adhesive material 111. It is known that the generally accepted temperature at which the adhesive properties of silicon rubber will not be adversely affected is about 200 C. As described above, the heat resistance of the adhesive material 111 needs to be sufficient to withstand conditions in which the bonding material is subjected to the process. Thus, the temperature of about 250 C mentioned above exceeds the accepted temperature; however, the present inventors have confirmed that since the adhesive material 111 is subjected to the process only for a few minutes, even if silicone rubber is used as the adhesive material 111 and is subjected to heating and cooling repeatedly, adhesiveness and the like are not adversely affected. In addition, by using an adhesive material 111 having the aforementioned heat resistance, it is possible to perform reflow heating on a flexible-substrate support jig 101 with an FPC 150 being adhered thereto.

In the case where rubber materials are used as the adhesive material 111, the adhesiveness of the rubber material tends to be reduced as the hardness of the rubber material is increased. Thus, taking into account the mounting of electronic components on an FPC 150, it is preferred that the lower limit of the hardness of the adhesive material 111 be 20 Hs and the upper limit be 50 Hs because if the material is too hard, its adhesiveness is reduced. If the hardness is set to values within the upper and lower limits or is within the range of the upper and lower limits, problems resulting from the hardness will not occur. The optimum values are 30 Hs or in the neighborhood of 30 Hs.

In the present embodiment, as will be described later, a wipe operation is performed on a flexible-substrate support jig 101, particularly on an adhesive material 111, with a cleaning cloth 261 provided on the cleaning apparatus 260. Therefore, the adhesive material 111 also requires abrasion resistance to prevent itself from being peeled off the flexible-substrate support jig 101 or to prevent a reduction in the adhesive function with respect to the substrate, caused by the wipe operation. It has been confirmed by the experiments conducted by the present inventors that the adhesive material 111 used in the present embodiment does not cause peeling or exhibit a reduction in the adhesive function even after performing the wipe operation about 24000 times. Thus, when the adhesive material 111 has abrasion resistance, even if the wipe operation is performed on the adhesive material 111, peeling of the adhesive material 111 or a reduction in the adhesive function does not occur; as a matter of fact, by the synergistic effect with the wipe operation, the optimum adhesive function can always be exhibited.

The size and shape of the adhesive region 112 may be determined based on the size and shape of an FPC 150 to be adhered to a flexible-substrate support jig 101. As will be described later, an FPC 150 adhered to the adhesive region 112 needs to be peeled off the flexible-substrate support jig 101 after electronic components have been bonded to the FPC 150. In the present embodiment, as will be described later, the bonding material is indirectly heated through the base member 110 and the adhesive material 111 such that the flexible-substrate support jig 101 is placed directly on a heater section 241 of a heating apparatus 240.

Figure 2:
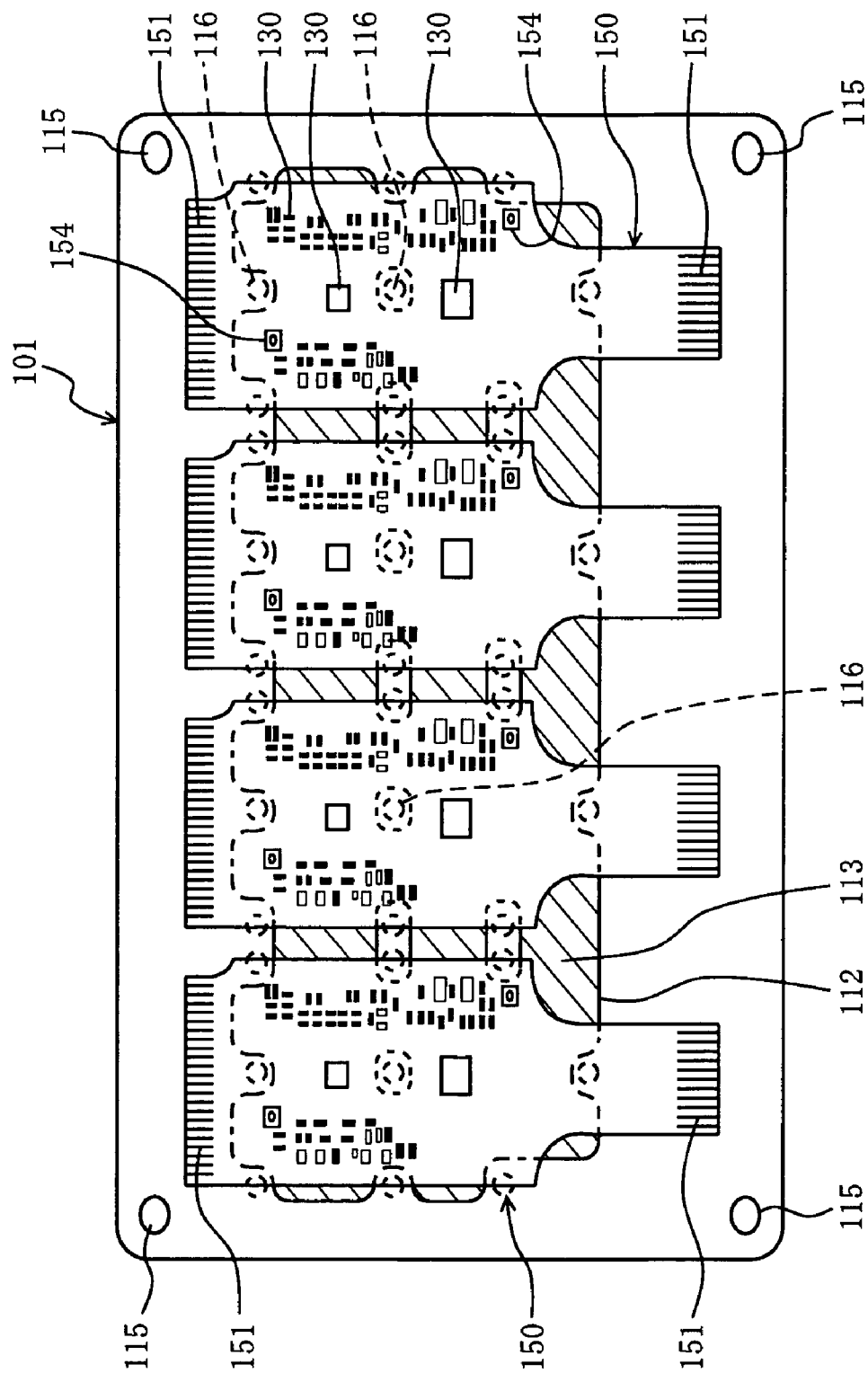
FIG. 2 is a plan view illustrating the substrate support jig shown in FIG. 1, to which flexible printed boards are being adhered.

Therefore, as shown in FIG. 2, if lead sections 151 of FPCs 150, which are portions to be connected to external terminals, are structured to be adhered to the adhesive material 111 in the adhesive region 112, the lead sections 151 may possibly curl or bend when peeling, making the FPC 150s become unusable. Thus, the adhesive region 112 should be formed on the flexible-substrate support jig 101 so as to correspond to at least a part of a non-lead section 152 of an FPC 150 to be adhered, which is a section other than a lead section 151.

The lead section 151 is an electrical connection portion, and thus it is undesirable for the lead section 151 to come into contact with or adhere to dirt or the like. In order to prevent the lead section 151 from coming into direct contact with the surface of the placement side 110a of the flexible-substrate support jig 101, it is preferable to form, though the present embodiment does not, a groove for preventing the lead section from coming into contact with the surface, in an area of the surface of the placement side 11a, which corresponds to the lead section 151. For example, the groove may be formed by cutting the surface of the placement side 110a in a depression with a depth of about 0.5 mm.

In the non-filling sections 114 where the adhesive material 111 is not provided, through holes 116 are provided so as to penetrate through the base member 110 in the thickness direction of the base member 110. If through holes 116 are provided in a portion where the adhesive material 111 is present, there may be a portion of the adhesive material 111 present at an opening of a through hole 116 that has not been thoroughly removed and has remained around the opening, resulting in the formation of the so-called burrs. However, as described above, by providing through holes 116 in a portion where the adhesive material 111 is not present, it is possible to prevent the formation of the burrs.

The through holes 116 in the present embodiment are, as will be described later, holes for allowing removing pins 251 to penetrate through the flexible-substrate support jig 101 so as to push up an FPC 150 from a back side 150b of the FPC 150 when peeling the FPC 150 off the flexible-substrate support jig 101. Thus, as shown in FIG. 2, a plurality of through holes 116 are provided in an FPC 150. It is preferred to provide through holes 116 particularly in portions corresponding to the peripheral and central portions of an FPC 150.

As shown in FIG. 3, on an FPC 150, there are mounted electronic components 130-1 (e.g., resistance chips, chip capacitors, and the like) and relatively large-size electronic components 130-2 (e.g., ICs such as QFPs, connectors, and the like). Note that the electronic components 130-1 and 130-2 will be collectively referred to as electronic components 130. The operation of pushing up an FPC 150 using the removing pins 251 is performed preferably in a no-component mounted portion 153, as shown in FIG. 3, which is a portion other than the area where the electronic components 130 are provided. Accordingly, it is preferred to provide through holes 116 in an area corresponding to the no-component mounted portion 153.

As described above, in the present embodiment, the adhesive region 112 is formed on a flexible-substrate support jig 101 by forming the filling section 113 on the flexible-substrate support jig 101. In another method of forming the adhesive region 112, a mold for forming the filling section 113 may be produced and placed on a flexible-substrate support jig 101, and then the adhesive material 111 may be flowed into the mold. However, the formation of the adhesive region 112 by forming the filling section 113 in a flexible-substrate support jig 101 using a milling machine, for example, may be easier in production and less costly than by producing a mold. In view of recent component-mounted circuit boards that are varied in kind, produced in small quantities, and remodeled at frequent intervals, flexible-substrate support jigs 101 each having the filling section 113 in the shape of a depression and the adhesive material 111 provided in the filling section 113 can be very effectively used as flexible-substrate support jigs for such component-mounted circuit boards.

Further, if necessary, positioning marks 115, which are holes in the shape of a circle, a rectangle or the like, may be provided in advance in a flexible-substrate support jig 101. Among positioning marks 115 shown in FIGS. 1 and 2, a circular hole at the lower left corner and an elongated hole at the upper right corner serve as main positioning marks 115-1 which are actually used in the present embodiment, and the other two holes serve as the auxiliary positioning marks 115-2. Thus, it may be sufficient to provide only the two main positioning marks 115-1. Note that the positioning mark 115 is not limited to a through hole; for example, it may be a printed mark or the like. The positioning mark 115 can be used for positioning a flexible-substrate support jig 101 when temporarily adhering an FPC 150 to the flexible-substrate support jig 101, and also for rough positioning when performing a cream solder printing on a copper foil pattern of an FPC 150 or when mounting electronic components 130.

Meanwhile, on an FPC 150, there are provided substrate-side marks 154, as shown in FIGS. 2 and 3. The substrate-side marks 154 may be used for positioning an FPC 150 when allowing the FPC 150 to temporarily adhere to a flexible-substrate support jig 101, and also for rough positioning when performing cream solder printing or when mounting electronic components 130.

Next, a circuit board production apparatus according to one embodiment of the present invention will be described below. In the circuit board production apparatus, while carrying an FPC 150 using the aforementioned flexible-substrate support jig 101, electronic components are mounted and bonded to the FPC 150, whereby a component-mounted circuit board is produced.

Figure 4:
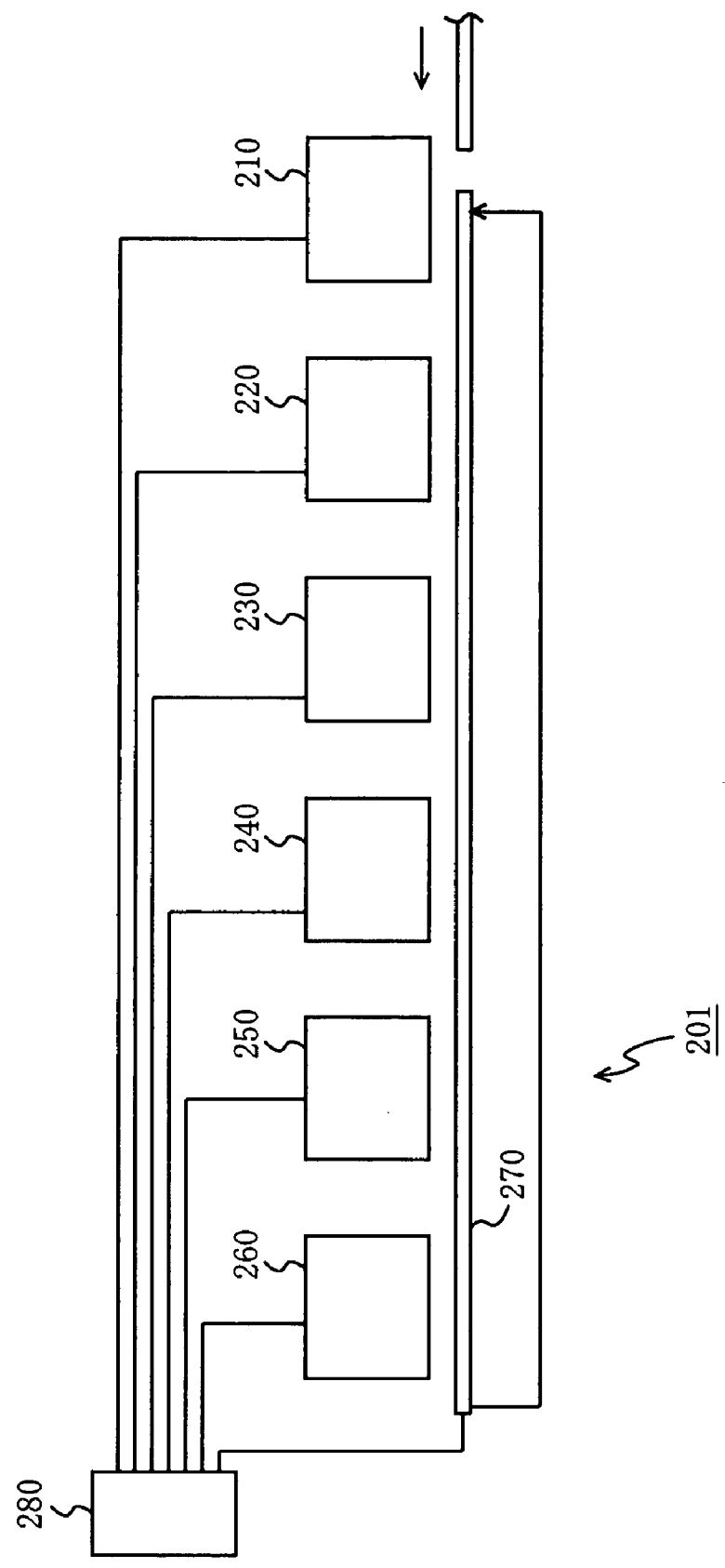
FIG. 4 is a diagram illustrating the entire configuration of a circuit board production apparatus according to another embodiment of the present invention.

As shown in FIG. 4, a circuit board production apparatus 201 includes: an adhesion apparatus 210; a bonding-material printing apparatus 220 which is an example serving as a bonding-material supply apparatus; a component mounting apparatus 230; a heating apparatus 240; and a substrate removing apparatus 250, and may further include a cleaning apparatus 260. In addition, the circuit board production apparatus 201 includes: a carrying apparatus 270 for carrying an FPC 150 in the order of the apparatuses 210, 220, 230, 240, 250, and 260; and a control apparatus 280 for controlling the entire operation of the circuit board production apparatus 201. Each of these apparatuses will be described in detail below.

Figure 5:
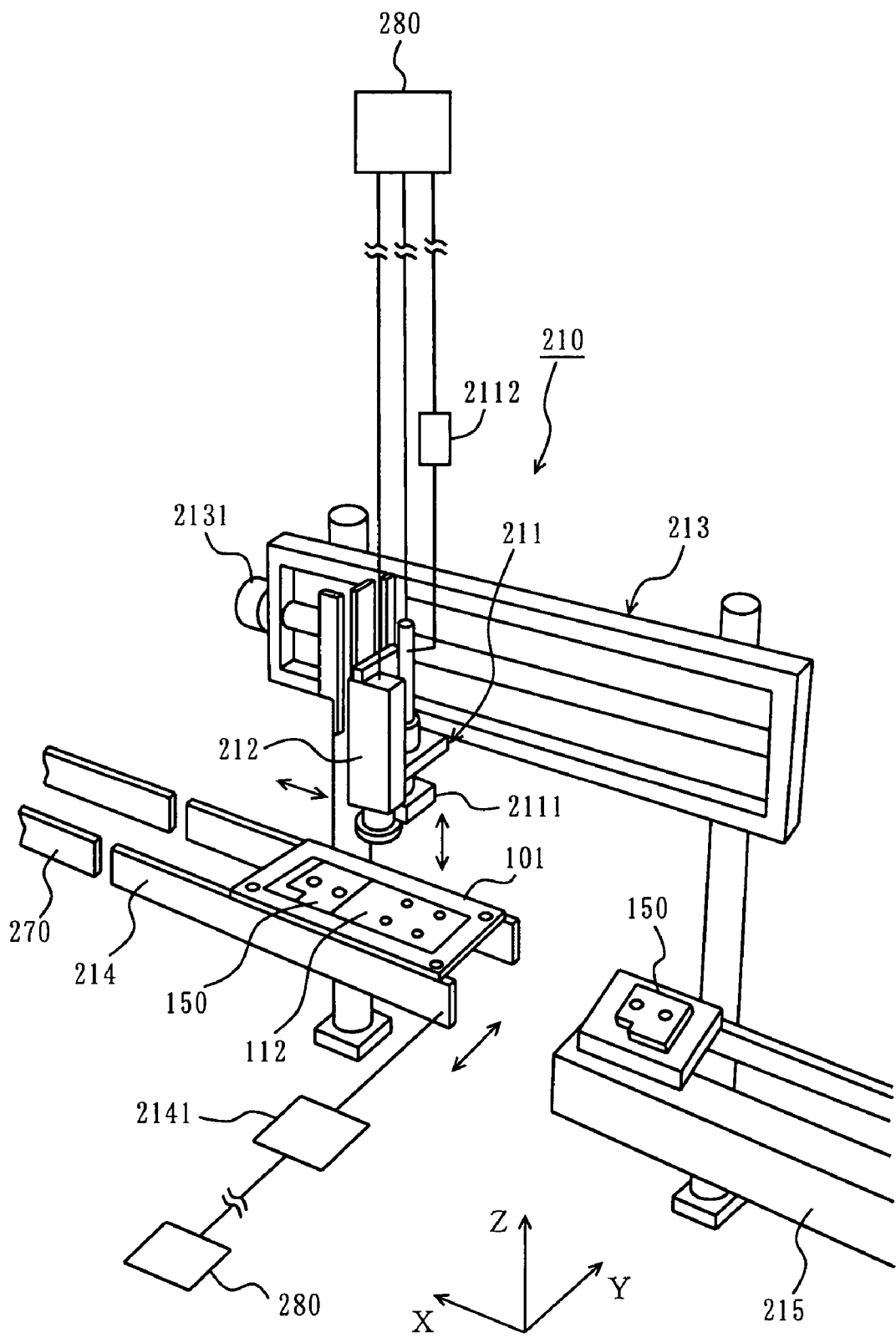
FIG. 5 is a perspective view illustrating an adhesion apparatus shown in FIG. 4.

The adhesion apparatus 210 allows an FPC 150 to temporarily adhere to a flexible-substrate support jig 101. As shown in FIG. 5, the adhesion apparatus 210 includes: a holding and pressing apparatus 211 for holding and pressing an FPC 150 against an adhesive region 112 of a flexible-substrate support jig 101 to allow for temporary adhesion of the FPC 150; and a recognition apparatus 212. The recognition apparatus is provided because recent copper patterns for FPCs 150 have become minute and when solder printing is performed on a plurality of FPCs 150 at a time, high position accuracy is required for the FPCs 150.

Figure 6:
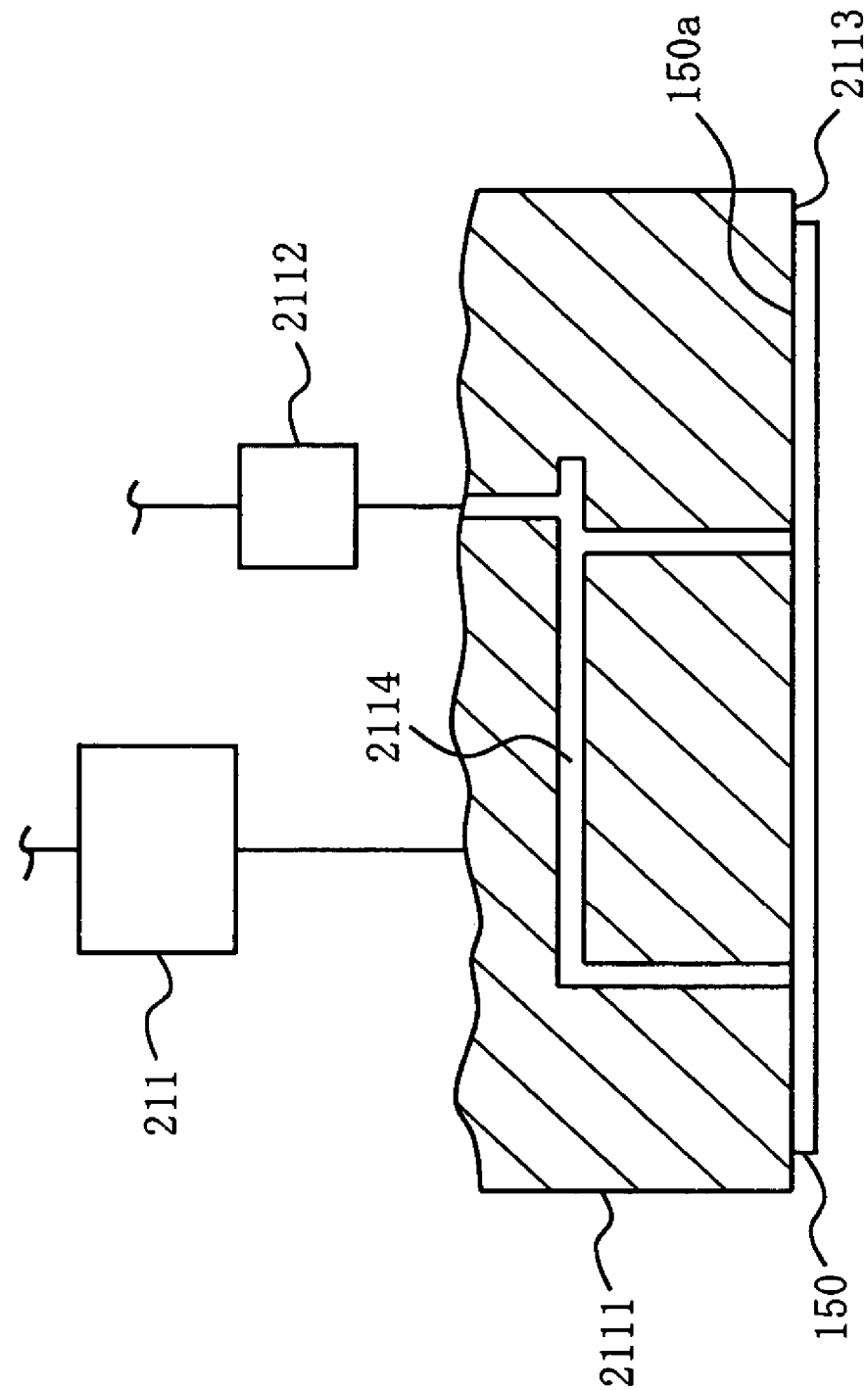
FIG. 6 is a cross-sectional view illustrating a holding member shown in FIG. 5.

In the present embodiment, the recognition apparatus 212 is mounted on the holding and pressing apparatus 211, as shown in the figure. As shown in FIG. 6, the holding and pressing apparatus 211 has a holding member 2111 with a flat holding surface 2113 for adhering and holding an FPC 150 by bringing the flat holding surface 2113 into contact with the entire surface or substantially entire surface of a component mounting/placement surface 150a of the FPC 150. A suction passage 2114 having at least one, preferably a plurality of openings along the holding surface 2113 is formed in the holding member 2111. A suction apparatus 2112 which performs the suction operation is connected to the suction passage 2114.

The FPC 150 that can be processed in the present embodiment is a flexible substrate in which electronic components 130 are mounted only on a component mounting/placement surface 150a, and a back side 150b, which is the opposite side of the component mounting/placement surface 150a, has no protrusions and is flat.

The recognition apparatus 212 recognizes the positioning marks 115 provided on a flexible-substrate support jig 101 for positioning the flexible-substrate support jig 101, and the substrate-side marks 154 provided on an FPC 150 for positioning the FPC 150.

The adhesion apparatus 210 includes a driving apparatus 213, a support jig positioning apparatus 214, and a flexible-substrate supply apparatus 215. In the present embodiment, as shown in the figure, the driving apparatus 213 has a ball screw mechanism which includes a driving source 2131 using a motor, for example. The driving apparatus 213 moves the holding and pressing apparatus 211 and the recognition apparatus 212 in X and Z directions.

The support jig positioning apparatus 214 can be connected to the carrying apparatus 270, and holds a flexible-substrate support jig 101 and can be moved, by the driving source 2141, in a Y direction. The flexible-substrate supply apparatus 215 supplies an FPC 150 to be placed on a flexible-substrate support jig 101. The operations of the component parts included in the adhesion apparatus 210 are controlled by the control apparatus 280. Specific operations will be described in the description of the operation of the circuit board production apparatus 201, as will be shown later.

Figure 7:
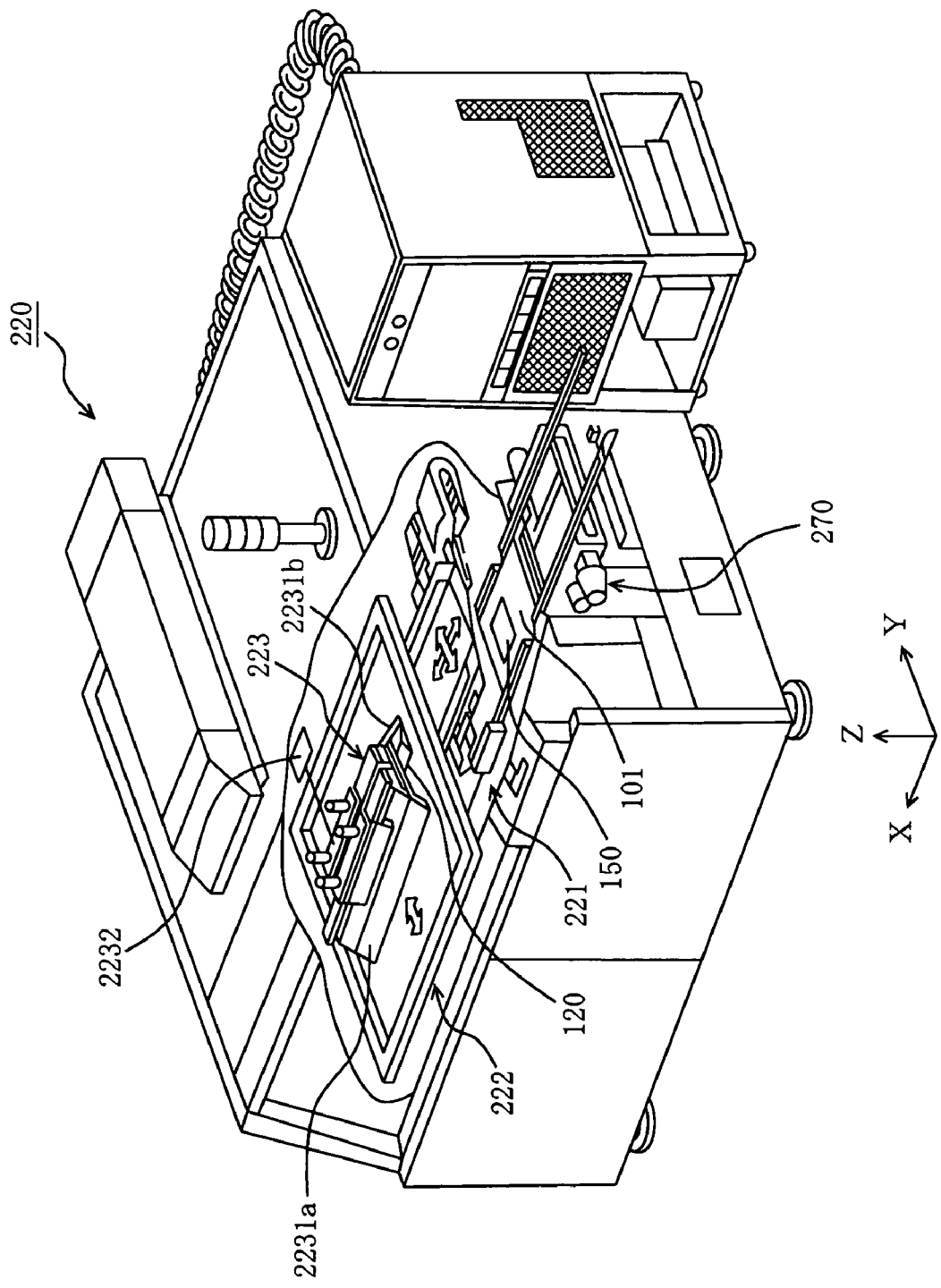
FIG. 7 is a diagram illustrating a bonding-material printing apparatus shown in FIG. 4.

As shown in FIG. 7, the bonding-material printing apparatus 220 includes: a jig holding apparatus 221 for holding and positioning a flexible-substrate support jig 101 having an FPC 150 temporarily adhered thereto, which has been carried in by the carrying apparatus 270; a screen mask 222 placed on the FPC 150 at a position determined by the jig holding apparatus 221; and an application apparatus 223 for applying a bonding material 120 to the FPC 150 through the screen mask 222.

Figure 8:
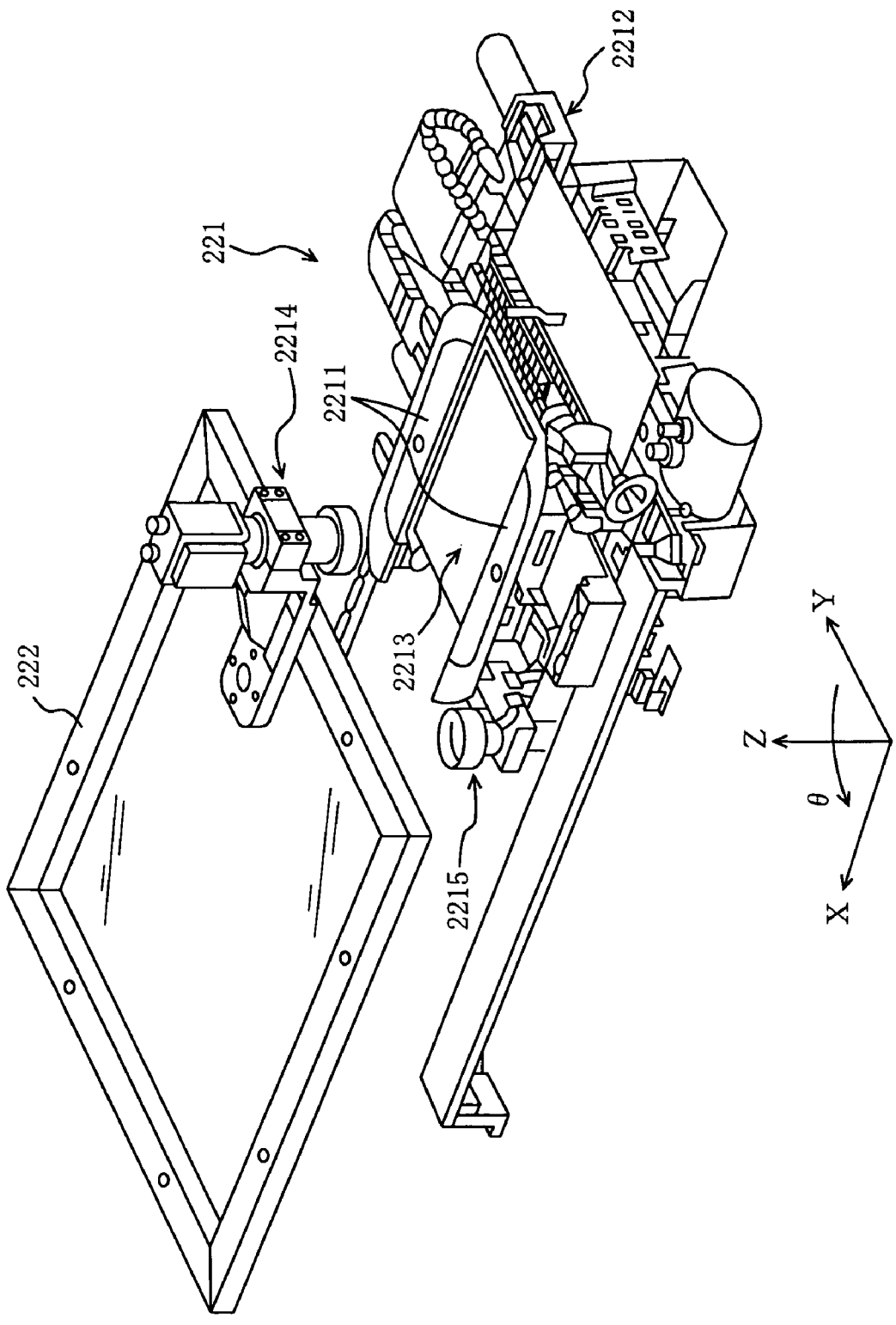
FIG. 8 is an enlarged view of a portion of a screen mask and a jig holding apparatus shown in FIG. 7.

FIG. 8 shows the detailed configuration of the jig holding apparatus 221. The jig holding apparatus 221 includes: a jig placement table 2213; a substrate recognition camera 2214 for taking an image of substrate-side marks 154 provided on an FPC 150; and a mask recognition camera 2215 for taking an image of alignment marks on a screen mask 222. The jig holding apparatus 221 is configured using a widely-used 4-axis stage.

The jig placement table 2213 holds a flexible-substrate support jig 101 having an FPC 150 temporarily adhered thereto, with sandwich members 2211. In addition, the jig placement table 2213 moves and rotates the flexible-substrate support jig 101 in the X, Y, Z, and θ directions by means of a driving section 2212 having a motor. These component parts are each connected to the control apparatus 280 and their operations are controlled by the control apparatus 280. Specific operations will be described in the description of the operation of the circuit board production apparatus 201, as will be shown later.

The substrate recognition camera 2214 takes an image of substrate-side marks 154 on an FPC 150, and information about the image is image processed by the control apparatus 280. Thus, the position of the FPC 150 temporarily adhered to the flexible-substrate support jig 101 can be found correctly. In addition, the mask recognition camera 2215 takes an image of alignment marks on a screen mask 222, and information about the image is also image processed, whereby the correct position of the screen mask 222 can be found. Based on these position information, the driving section 2212 is driven so that the FPC 150 is positioned at the correct position with respect to a hole pattern of the screen mask 222, and thus high-accuracy positioning is achieved.

The application apparatus 223 includes: squeegees 2231a and 2231b; and a squeegee driving section 2232 for moving the squeegees 2231a and 2231b back and forth along the Y direction. The operation of the squeegee driving section 2232 is controlled by the control apparatus 280. The squeegees 2231a and 2231b move across a screen mask 222 by means of the squeegee driving section 2232, whereby a bonding material 120 provided on the screen mask 222 is printed on an FPC 150 at a land position through a hole pattern.

Figure 9:
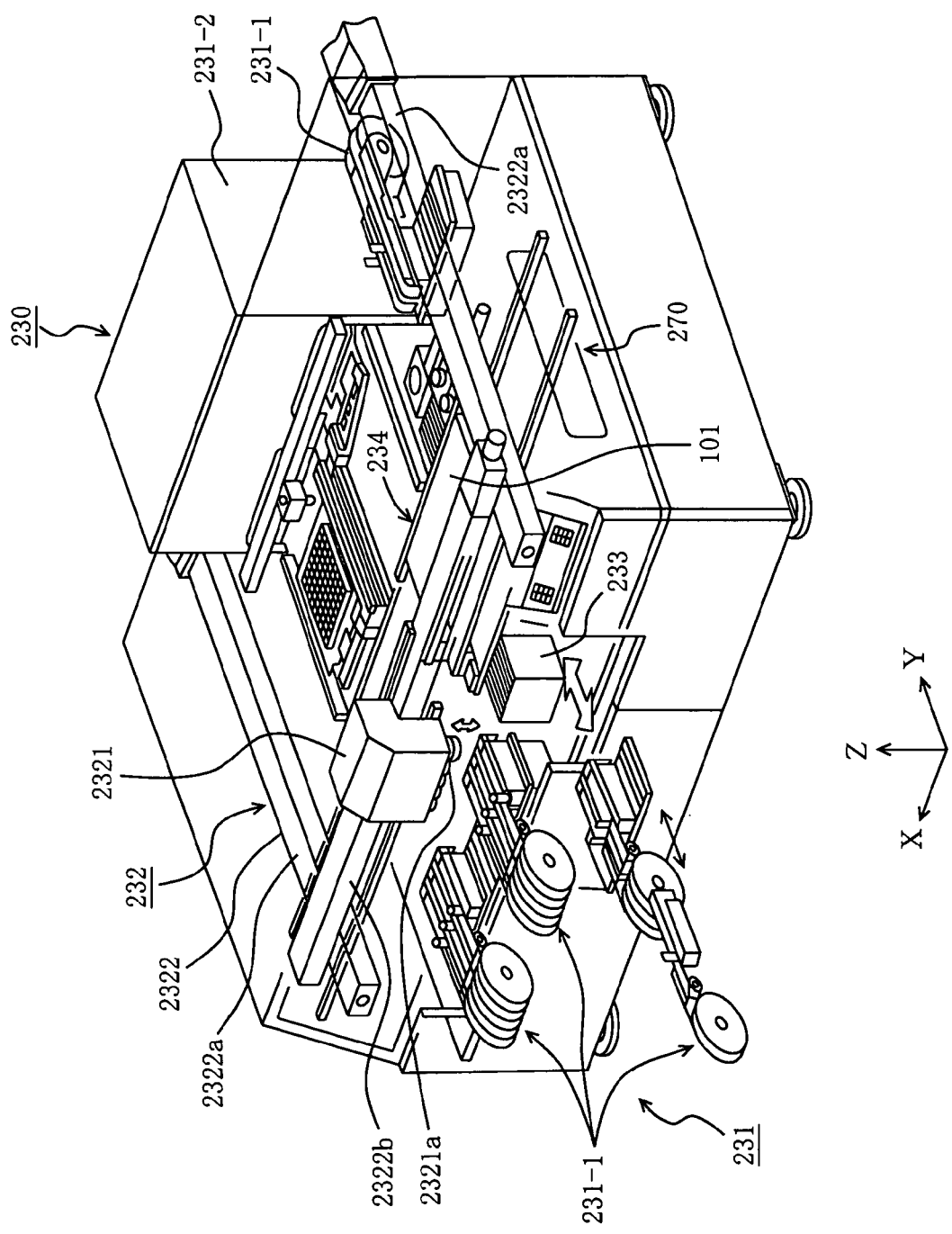
FIG. 9 is a diagram illustrating a component mounting apparatus shown in FIG. 4.

As shown in FIG. 9, the component mounting apparatus 230 includes: a component supply apparatus 231 for supplying electronic components 130 to be mounted on an FPC 150 temporarily adhered to a flexible-substrate support jig 101; and a component holding apparatus 232 for holding the electronic components 130 from the component supply apparatus 231 and mounting the electronic components 130 on the FPC 150.

In the component mounting apparatus 230, the component supply apparatus 231 includes: the so-called cassette type component supply apparatuses 231-1 each including a reel on which a component supply tape containing electronic components 130-1 (e.g., resistance chips, chip capacitors, and the like) is wound, and supplying the components by unreeling the component supply tapes; and the so-called tray type component supply apparatus 231-2 for supplying relatively large-size electronic components 130-2 (e.g., ICs such as QFPs, connectors, and the like). The operations of the component supply apparatuses 231-1 and 231-2 are each controlled by the control apparatus 280. Note that the electronic components 130-1 and 130-2 will be collectively referred to as electronic components 130.

The component holding apparatus 232 includes: a component holding head 2321 for holding electronic components supplied from the component supply apparatus 231 and mounting the electronic components on an FPC 150; and a moving apparatus 2322 for moving the component holding head 2321 in the X and Y directions. The operations of the component holding head 2321 and the moving apparatus 2322 are controlled by the control apparatus 280. In the present embodiment, the component holding head 2321 includes four mounting heads arranged in a line. The mounting heads each have: a nozzle 2321a for sucking electronic components; an actuator for moving the nozzle 2321a up and down in the axial direction of the nozzle 2321a; and a motor for rotating the nozzle 2321a in the direction about which the nozzle 2321a rotates.

The moving apparatus 2322 includes: a pair of Y driving sections 2322a extended in parallel with each other in the Y direction; and an X driving section 2322b laid across the pair of Y driving sections 2322a and extended in the X direction. The X driving section 2322b has the component holding head 2321 mounted thereto. The component holding head 2321 can move in the X direction by means of the X driving section 2322b, and the X driving section 2322b can move in the Y direction by means of the Y driving section 2322a. Namely, the component holding head 2321 can move freely in the X and Y directions by means of the X driving section 2322b and the Y driving section 2322a.

Through the component mounting apparatus 230 is passed the carrying apparatus 270 to which is supplied a flexible-substrate support jig 101 to which an FPC 150 having a bonding material 120 applied thereto is temporarily adhered. A flexible-substrate support jig 101 having been carried is held on a holding table 234 for holding the flexible-substrate support jig 101. In addition, the component mounting apparatus 230 includes a recognition apparatus 233 for taking an image of a holding state of electronic components sucked by the nozzle 2321a of the component holding head 2321 and determining two-dimensional displacement from the correct holding position.

The recognition apparatus 233 includes an imaging camera and also a lighting section having, for example, LEDs (light emitting diodes) arranged in a multistage structure. The recognition apparatus 233 is connected to the control apparatus 280, and imaging information is image processed by the control apparatus 280 and then displacement is determined. The determined displacement information is used to correct the amount of movement of the component holding head 2321 so that the electronic components can be mounted in a predetermined mounting position on an FPC 150. The correction of the amount of movement of the component holding head 2321 also includes a rotation angle θ relative to the direction about which the nozzle 2321a rotates.

In the component mounting apparatus 230 thus configured, the component holding head 2321 sucks electronic components from a predetermined component supply apparatus 231 based on mounting information which is pre-stored in the control apparatus 280, and the holding posture is recognized by the recognition apparatus 233, and thereafter the component holding head 2321 mounts the electronic components on an FPC 150 in a predetermined mounting position.

Figure 10:
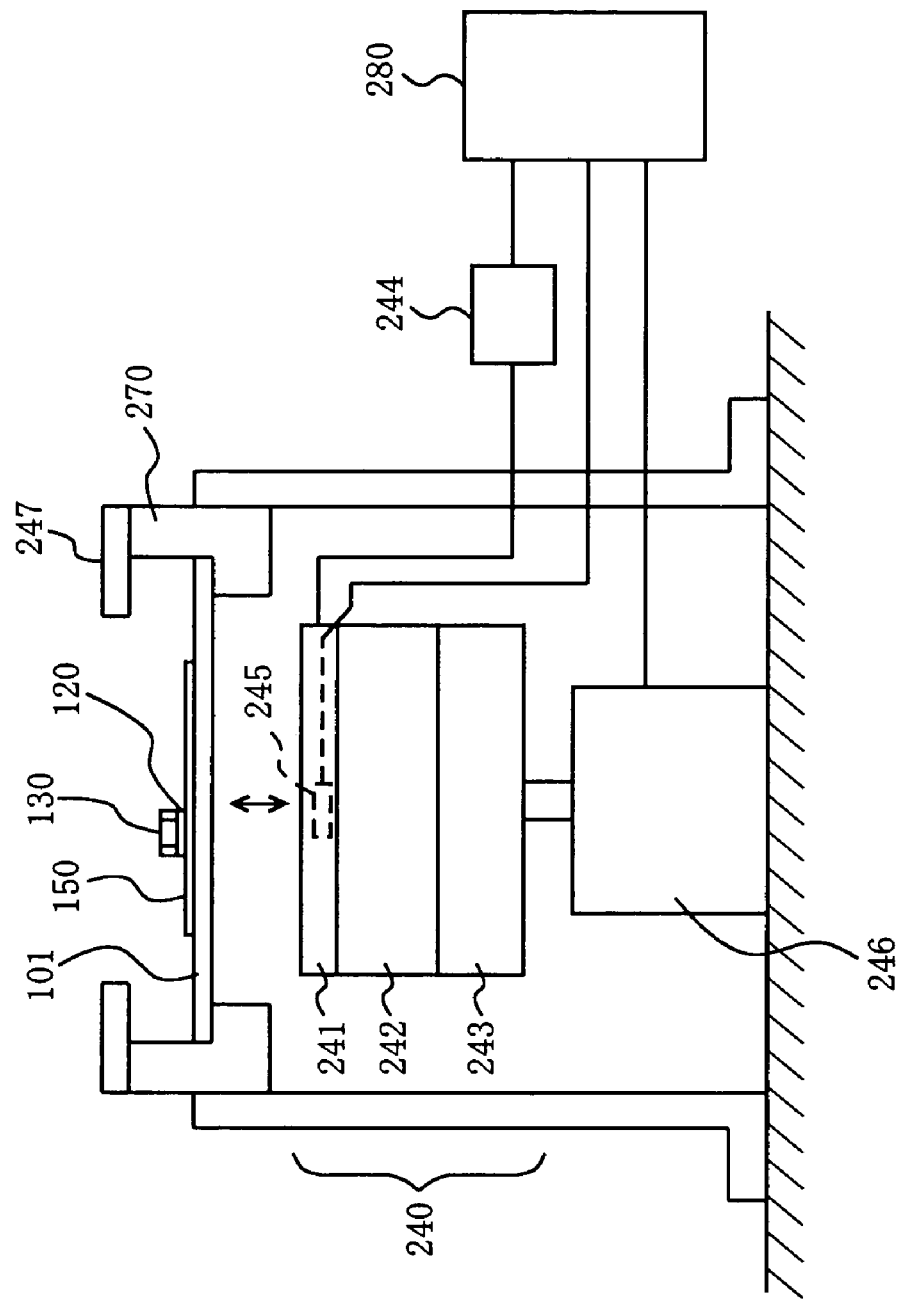
FIG. 10 is a diagram illustrating a heating apparatus shown in FIG. 4.
Figure 11:
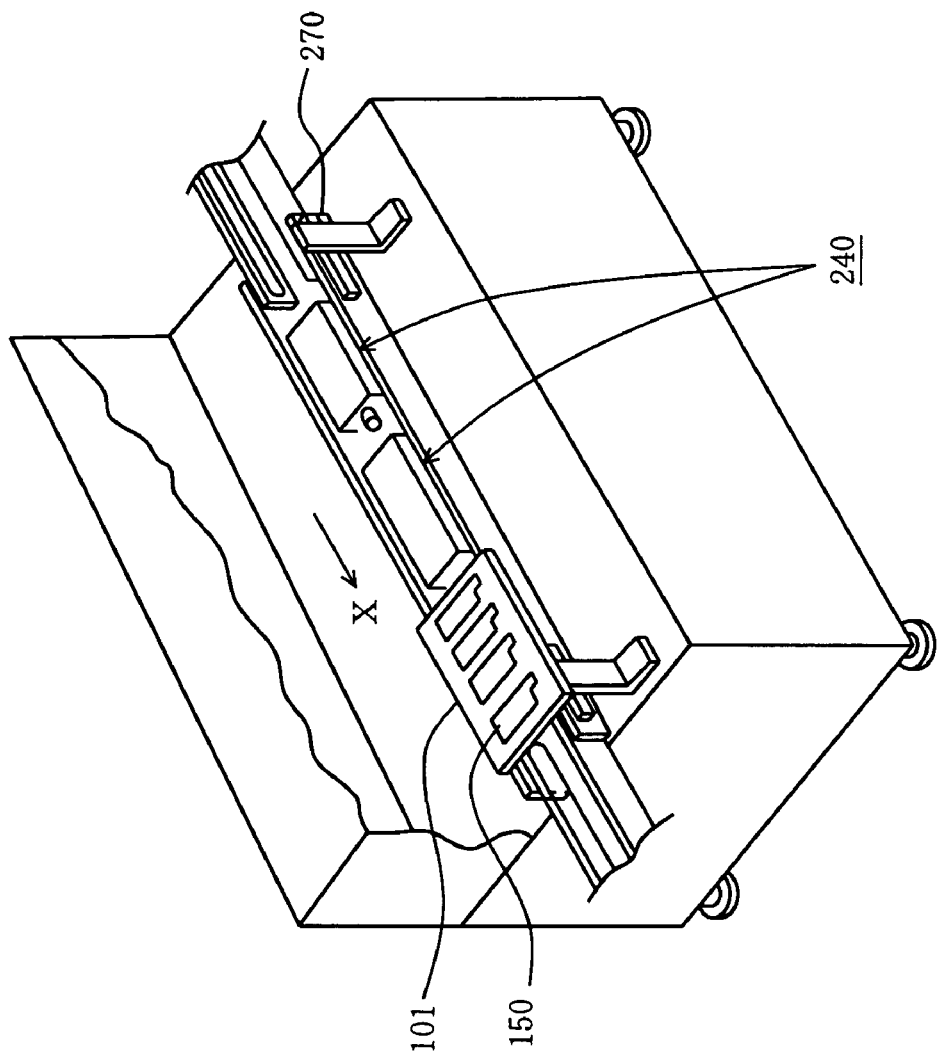
FIG. 11 is a perspective view for explaining the arrangement of the heating apparatus shown in FIG. 10.

In the present embodiment, as shown in FIG. 10, the heating apparatus 240 is provided below the carrying path of the carrying apparatus 270, and includes a heating table 241, a heat insulating section 242, a base section 243, and a power supply section 244. On the base section 243 are stacked the heat insulating section 242 and the heating table 241 in this order. In the present embodiment, as shown in FIG. 11, two heating apparatuses 240 are arranged in a line in an X direction which is the carrying direction of the carrying apparatus 270, and thus two flexible-substrate support jigs 101 can be heated at the same time.

The heating table 241 is composed of the so-called ceramic heater, and current is supplied to the heater line of the ceramic heater from the power supply section 244. The heating table 241 continues to generate heat until it reaches a temperature at which solder, which is an example serving as the bonding material 120, will melt. In the case of heaters which provide the so-called constant heat, other than ceramic heaters, since they require several seconds to several minutes to respond to the rise and fall of temperature, productivity is low, making them impractical. On the other hand, in the case of ceramic heaters, they can respond within one second or less, making it possible to set a temperature profile.

The temperature of the heating table 241 can be measured by a temperature sensor, e.g., a thermocouple 245 provided in the heating table 241, and the measured temperature is communicated to the control apparatus 280. The power supply section 244 is connected to the control apparatus 280. The control apparatus 280 performs feedback control on the temperature of the heating table 241 based on temperature information supplied from the thermocouple 245 and a temperature profile which is preset to control the temperature of a circuit board. In order to obtain easy temperature control of the heating table 241, it is preferred that a cooling apparatus that provides cooling by supplying air, for example, be connected to the heating table 241 and the base section 243.

In the present embodiment, the heating apparatus 240 moves up and down by means of an up-and-down driving section 246 provided below the base section 243. When the heating apparatus 240 is positioned in an up position, the heating table 241 and a no placement side 110b of a flexible-substrate support jig 101 come into contact with each other and the flexible-substrate support jig 101 is sandwiched and fixed between the heating table 241 and a holding member 247, and also an FPC 150 and solder 120 are indirectly heated by the heat of the heating table 241 through the flexible-substrate support jig 101. After the solder 120 has melted, the heating apparatus 240 is caused to move down by means of the up-and-down driving section 246 so as to keep the heating table 241 and the flexible-substrate support jig 101 out of contact with each other, at which point the heating operation is stopped.

Figure 12:
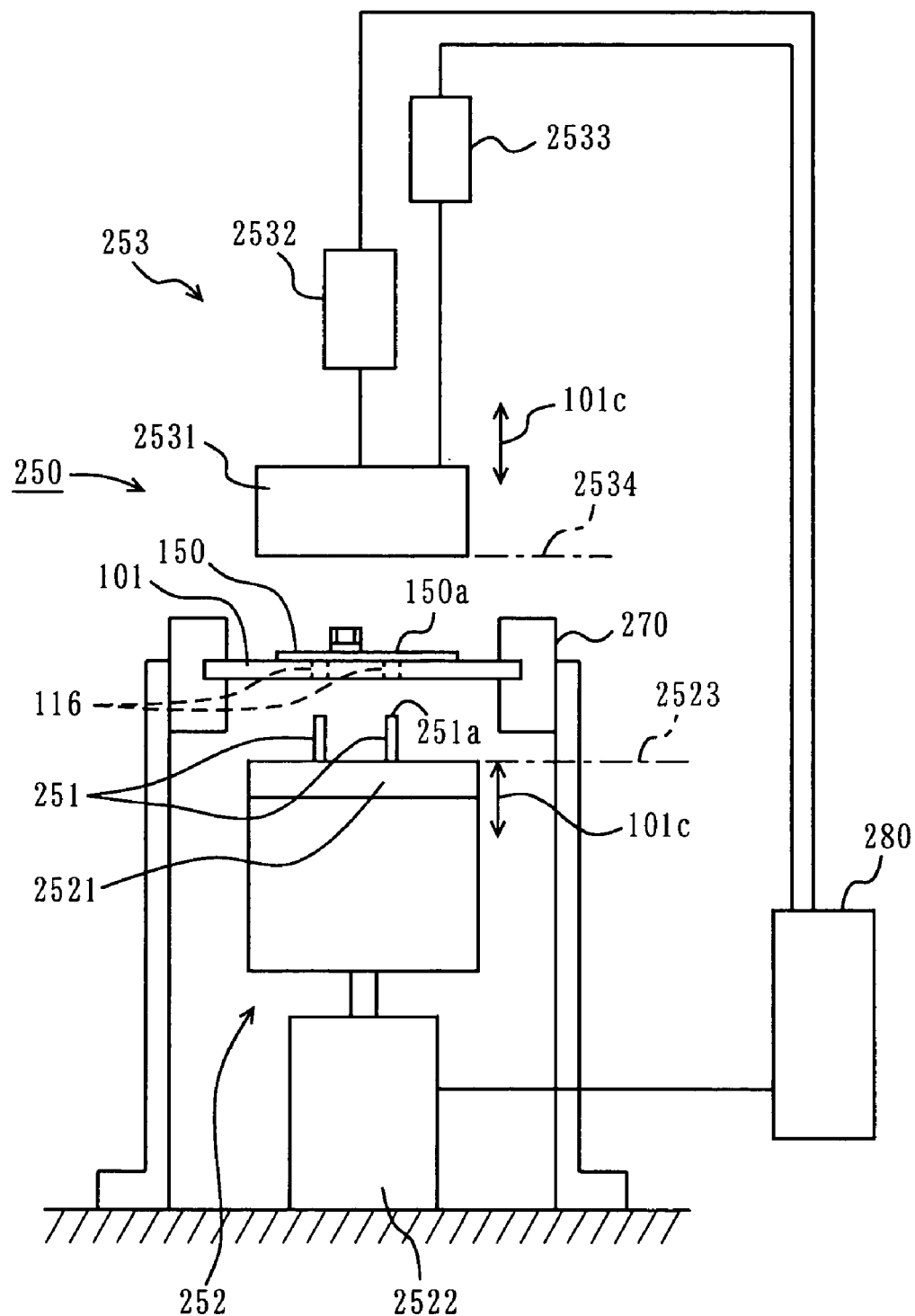
FIG. 12 is a diagram illustrating a substrate removing apparatus shown in FIG. 4.

As shown in FIG. 12, the substrate removing apparatus 250 includes: removing pins 251 that can go into through holes 116 provided in a flexible-substrate support jig 101; peeling driving apparatus 252 for peeling an FPC 150 temporarily adhered to the flexible-substrate support jig 101 off the flexible-substrate support jig 101 by pushing up the FPC 150 with the removing pins 251 which are caused to penetrate through the through holes 116 by moving the removing pins 251 and the flexible-substrate support jig 101 relatively to each other in the direction of the thickness 101c of the flexible-substrate support jig 101; and a flexible-substrate holding apparatus 253 for holding the FPC 150 when peeled off the flexible-substrate support jig 101 by the peeling driving apparatus 252.

Carrying of a flexible-substrate support jig 101 having an FPC 150 temporarily adhered thereto performed by the carrying apparatus 270 is stopped at the point where the peeling driving apparatus 252 is provided, and the flexible-substrate support jig 101 having the FPC 150 temporarily adhered thereto is supported and fixed by the carrying apparatus 270. Although, as described above, the removing pins 251 and the flexible-substrate support jig 101 can be configured to move relatively to each other, in the present embodiment, the removing pins 251 are caused to move by the peeling driving apparatus 252 with respect to the flexible-substrate support jig 101 being held and fixed by the carrying apparatus 270.

The peeling driving apparatus 252 includes: a pin mounting plate 2521 having the removing pins 251 vertically arranged thereon so as to correspond to the through holes 116 provided in the flexible-substrate support jig 101; and a pin elevation apparatus 2522 for moving the pin mounting plate 2521 in the thickness direction 101c which is equivalent to the Z direction. The operation of the pin elevation apparatus 2522 is controlled by the control apparatus 280.

The flexible-substrate holding apparatus 253 includes: a removing member 2531 for holding the entire surface of the FPC 150 removed from the flexible-substrate support jig 101; a removing-member moving apparatus 2532 for moving the removing member 2531 in the thickness direction 101c and in the X and Y directions; and a suction apparatus 2533 connected to the removing member 2531 and causing the FPC 150 to suck to the removing member 2531. The operations of the removing-member moving apparatus 2532 and the suction apparatus 2533 are controlled by the control apparatus 280. Specific operations will be described in the description of the operation of the circuit board production apparatus 201, as will be shown later.

Figure 15:
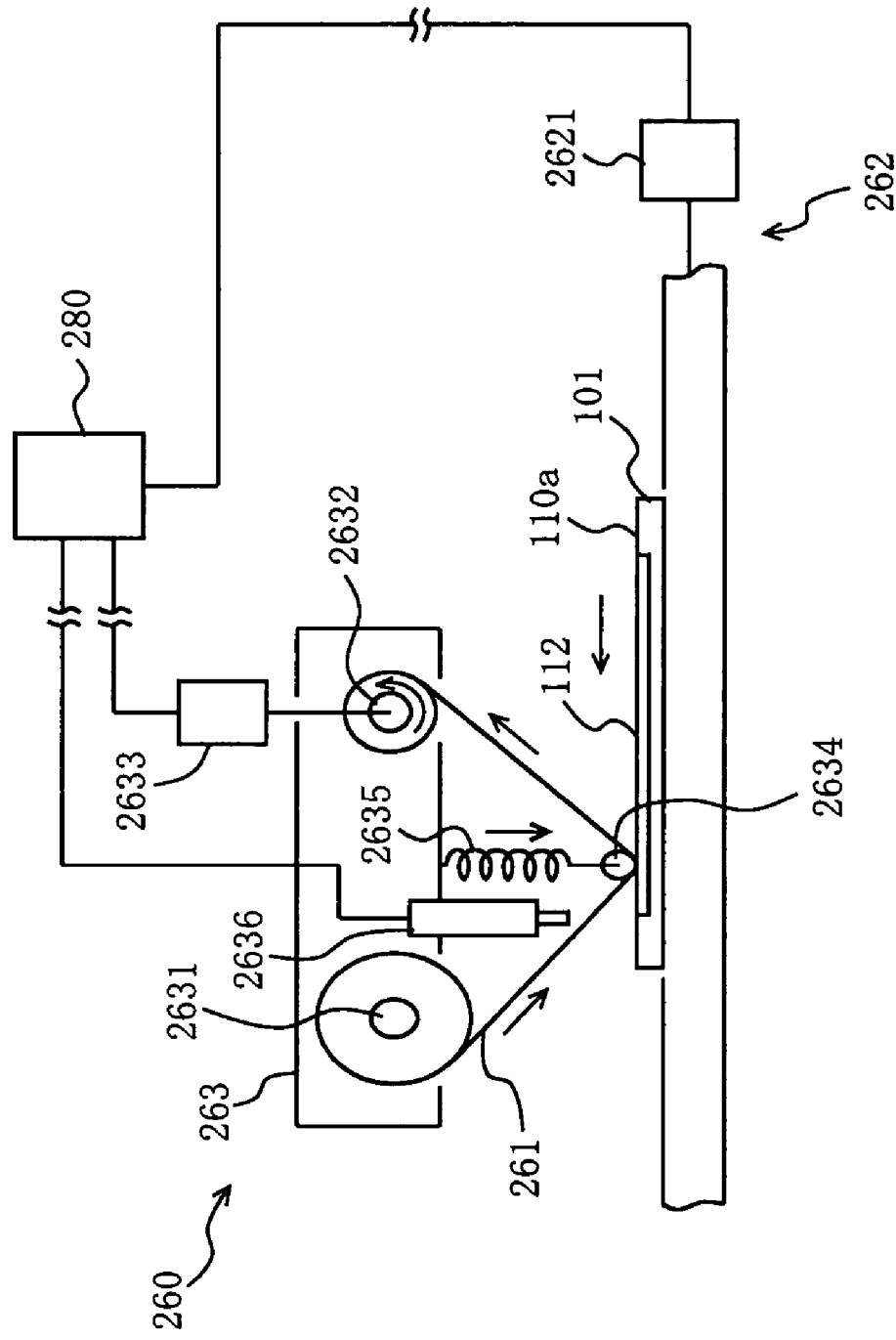
FIG. 15 is a diagram illustrating a cleaning apparatus shown in FIG. 4.

Next, the cleaning apparatus 260 will be described below. As shown in FIG. 15, the cleaning apparatus 260 includes: a cleaning cloth 261 containing a detergent for removing, more specifically, wiping off the dust from an adhesive region 112, particularly, from an adhesive material 111; and a moving apparatus 262 for bringing the cleaning cloth 261 into contact with the adhesive region 112, particularly, the adhesive material 111, and moving a flexible-substrate support jig 101 and the cleaning cloth 261 relatively to each other.

The cleaning cloth 261 is in belt form, wound around a core, and generates very little dust, and is mounted on a dust removing apparatus 263. The dust removing apparatus 263 includes: a supply-side roll 2631 on which a new cleaning cloth 261 (yet to be used) is provided; a winding-side roll 2632 rotated by a driving source 2633, on which a cleaning cloth which has been used is wound; a press roller 2634; and a detergent supply apparatus 2636.

The press roller 2634 is provided between the supply-side roll 2631 and the winding-side roll 2632, and is composed of elastic materials such as silicone rubber, for example. The press roller 2634 presses the cleaning cloth 261 against the adhesive region 112 having an adhesive material 111 of the flexible-substrate support jig 101 and removes the dust on the adhesive region 112, particularly, on the adhesive material 111. The press roller 2634 applies a force to the flexible-substrate support jig 101 by means of a spring 2635 which is an example providing a press function. The detergent supply apparatus 2636 supplies a detergent to a cleaning cloth 261 just before being pressed by the press roller 2634 against the adhesive region 112. The operation of the detergent supply apparatus 2636 is controlled by the control apparatus 280. As the detergent, solvents such as alcohol and acetone can be used.

Although, as described above, in the present embodiment cleaning is performed on the adhesive region 112 using the cleaning cloth 261, the cleaning may be performed on the entire surface of a placement side 110a of the flexible-substrate support jig 101 using the cleaning cloth 261 in conjunction with the press roller 2634.

Although as described above, the moving apparatus 262 can be configured such that the flexible-substrate support jig 101 and the cleaning cloth 261 move relatively to each other, in the present embodiment, the flexible-substrate support jig 101 is allowed to move while the dust removing apparatus 263 is being fixed. The moving apparatus 262 is a moving mechanism having a driving source 2621, for moving the flexible-substrate support jig 101 in the X direction. As in the present embodiment, the carrying apparatus 270 may be used in place of the moving apparatus 262. Therefore, in the present embodiment, the moving apparatus 262 is the same as the carrying apparatus 270.

In the cleaning apparatus 260 thus configured, while a flexible-substrate support jig 101 is being carried by the moving apparatus 262, the cleaning cloth 261, which is wound onto the winding-side roll 2632 rotated by the driving source 2633, is pressed against the flexible-substrate support jig 101 with the press roller 2634. Thus, cleaning can be performed efficiently on a flexible-substrate support jig 101 with always a new cleaning cloth 261.

The operations of a circuit board production apparatus 201 configured in the manner described above, that is, a method of producing a circuit board will be described below. The method of producing a circuit board is performed such that a control apparatus 280 controls operations in accordance with programs for producing a circuit board, stored in the control apparatus 280.

In an adhesion apparatus 210 configured in the manner described above, an FPC 150 is carried in the adhesion apparatus 210 by a flexible-substrate supply apparatus 215, and a flexible-substrate support jig 101 is carried in a support jig positioning apparatus 214 by a carrying apparatus 270. The flexible-substrate support jig 101 is placed in a predetermined position by the support jig positioning apparatus 214.

Through the operation of a driving apparatus 213, a recognition apparatus 212 takes an image of positioning marks 115 of the flexible-substrate support jig 101. The information about the image is sent out to the control apparatus 280. Then, the recognition apparatus 212 takes an image of substrate-side marks 154 of the FPC 150, and the information about the image is sent out to the control apparatus 280. Subsequently, a holding and pressing apparatus 211 is driven so that the entire surface of a component mounting/placement surface 150a of the FPC 150 is sucked to a holding member 2111.

The control apparatus 280 activates the driving apparatus 213 and the support jig positioning apparatus 214 for positioning, based on the image information about the positioning marks 115 and the substrate-side marks 154 so that the FPC 150 can be placed in a predetermined substrate placement position on the flexible-substrate support jig 101 based on the programs for producing a circuit board, and places the FPC 150 held onto the holding member 2111 in the substrate placement position on the flexible-substrate support jig 101, and then presses the FPC 150 against an adhesive material 111.

By the pressing operation, the FPC 150 is temporarily adhered to the flexible-substrate support jig 101 in the substrate placement position via the adhesive material 111. FIG. 5 illustrates the case where two FPCs 150 can be temporarily adhered to one flexible-substrate support jig 101, whereas FIG. 2 illustrates the case where four FPCs 150 can be temporarily adhered to one flexible-substrate support jig 101. The number of FPCs 150 to be temporarily adhered to one flexible-substrate support jig 101 is arbitrary, and may be determined based on the size of a flexible-substrate support jig 101, target production levels, or the like.

In the present embodiment, after the pressing, the recognition apparatus 212 again takes images of the positioning marks 115 and the substrate-side marks 154 so that the control apparatus 280 can verify the amount of displacement of the FPC 150 from the predetermined substrate placement position. By thus taking again images of the positioning marks 115 and the substrate-side marks 154 by the recognition apparatus 212 after the pressing, whether a predetermined number of FPCs 150 is being temporarily adhered to the flexible-substrate support jig 101 can also be verified.

By thus allowing an FPC 150 to temporarily adhere to a flexible-substrate support jig 101, the FPC 150 and the flexible-substrate support jig 101 can be integrated while ensuring the flatness of the component mounting/placement surface 150a of the FPC 150. Thus, in subsequent mounting processes, the FPC 150 can be treated in the same manner as the substrate of conventional electronic circuit boards.

Even in the case where a plurality of FPCs 150 are supported by a flexible-substrate support jig 101, it requires only the operation of placing and pressing each FPC 150 against an adhesive region 112, and it does not require holding clamps which are conventionally required; therefore, operations become very easy compared to the conventional case and the operations can be automated as described above, resulting in a reduction in production costs.

The flexible-substrate support jig 101 having the FPC 150 temporarily adhered thereto is carried by the carrying apparatus 270 in an X direction which is a carrying direction, and supplied to the subsequent bonding-material printing apparatus 220.

In the bonding-material printing apparatus 220, the flexible-substrate support jig 101 having the FPC 150 temporarily adhered thereto is held and positioned by a jig holding apparatus 221. In the positioning operation, positioning is performed taking into account the amount of displacement of the FPC 150 from the predetermined substrate placement position. After the positioning, a screen mask 222 is placed on the FPC 150, and thereafter cream solder, which serves as a bonding material 120, is applied by an application apparatus 223 to an area of the FPC 150 where electronic components 130 are to be mounted, through the screen mask 222. After the application, the screen mask 222 is removed from the FPC 150.

Figure 16:
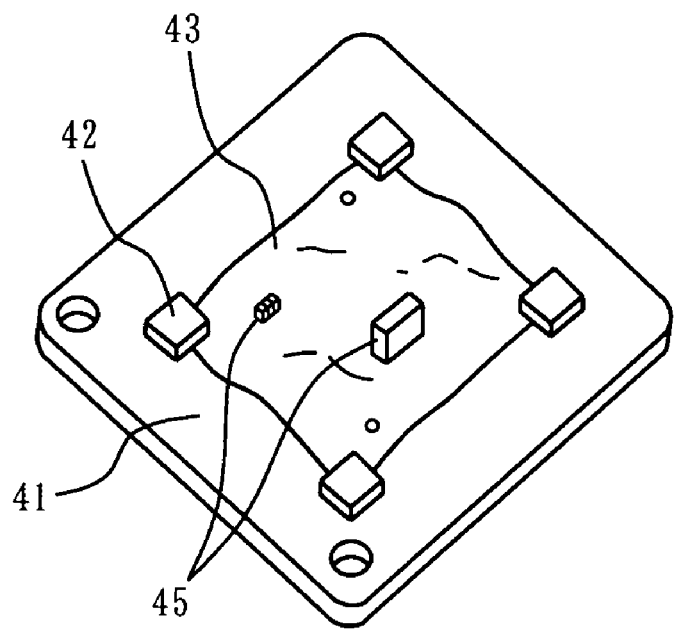
FIG. 16 is a perspective view illustrating a conventional metal plate for holding a flexible substrate, on which a substrate is being placed.
Figure 17:
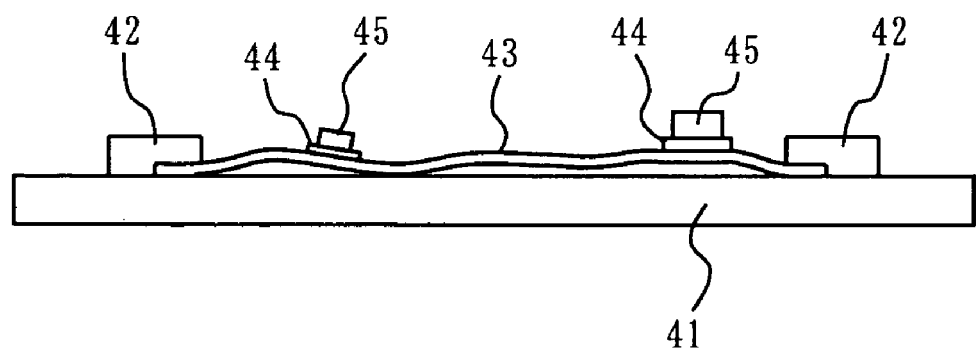
FIG. 17 is a side view of the metal plate and the substrate shown in FIG. 16.

In the present embodiment, as described above, an FPC 150 is held while being temporarily adhered to a flexible-substrate support jig 101, and therefore, holding clamps 42 for fixing a flexible substrate 43 are not required, as are required by a conventional metal plate 41 shown in FIGS. 16 and 17. Therefore, when a bonding material 120 is printed on an FPC 150 through a screen mask 222, a special screen mask which takes into account the holding clamps 42 is not required; instead, a conventionally used screen mask 222 can be used and the screen mask 222 can come into close contact with a component mounting/placement surface 150a of the FPC 150. Accordingly, the printing quality of the bonding material 120 is not degraded, and misposition of the printing or deformation of the bonding material 120 does not occur. Thus, it is possible to stably perform high-quality component mounting in the next process.

The flexible-substrate support jig 101 to which the FPC 150 having the bonding material 120 thus applied thereto is temporarily adhered, is carried in the X direction by the carrying apparatus 270 and supplied to the subsequent component mounting apparatus 230.

In the component mounting apparatus 230, electronic components 130 supplied from a component supply apparatus 231 are held by a component holding apparatus 232, and then mounted on a predetermined mounting area of the FPC 150. In the control apparatus 280, the so-called mounting information which shows the relationship between the types of the electronic components 130 and the mounting areas of the FPC 150 is pre-stored. The component holding apparatus 232 mounts the electronic components 130 in accordance with the mounting information. In the mounting operation, positioning is performed taking into account the amount of displacement of the FPC 150 from the predetermined substrate placement position.

The flexible-substrate support jig 101 to which the FPC 150 having the electronic components 130 thus mounted thereon is temporarily adhered, is carried in the X direction by the carrying apparatus 270 and supplied to the subsequent heating apparatus 240.

The flexible-substrate support jig 101 having the FPC 150 temporarily adhered thereto, which has been carried in the heating apparatus 240, is held and fixed in a predetermined position in the carrying apparatus 270. Then, as described above, a heating table 241 is elevated by an up-and-down driving section 246 from beneath the flexible-substrate support jig 101 to bring the flexible-substrate support jig 101 into contact with the heating table 241, and then the heating table 241 is further elevated to sandwich and fix the flexible-substrate support jig 101 between the heating table 241 and a holding member 247.

Subsequently, the heating table 241 is heated, whereby the FPC 150 and solder which serves as the bonding material 120 are indirectly heated through the flexible-substrate support jig 101. The heating control at this point is performed in accordance with a temperature profile which is pre-stored in the control apparatus 280. For example, the temperature profile may be of a plurality of types so that appropriate heating control can be performed for each type of the electronic components 130.

After the solder has melted, the heating apparatus 240 is caused to move down by the up-and-down driving section 246 so as to keep the heating table 241 and the flexible-substrate support jig 101 out of contact with each other, at which point the heating operation is stopped. The molten solder is solidified as the heating is stopped, whereby the electronic components 130 are fixed to the FPC 150.

By thus heating the flexible-substrate support jig 101 being placed on the heating table 241, it is possible to prevent, even in the case of using film-like, light-weighted substrates such as FPCs 150, substrates from being blown away by air currents, unlike the so-called reflow method in which soldering is performed by stirring the air in a furnace and heating a circuit board.

The flexible-substrate support jig 101 to which the FPC 150 having the electronic components 130 thus bonded thereto is temporarily adhered, is carried in the X direction by the carrying apparatus 270 and supplied to the subsequent substrate removing apparatus 250.

In the substrate removing apparatus 250, the following operations are performed. Specifically, when the flexible-substrate support jig 101 having the FPC 150 temporarily adhered thereto is carried in the substrate removing apparatus 250 by the carrying apparatus 270, as shown in FIG. 12, a pin mounting plate 2521 having removing pins 251 vertically arranged thereon is positioned in a down position 2523, and the removing pins 251 are not being in through holes 116; on the other hand, a removing member 2531 is positioned in a standby position 2534 which is above the FPC 150. When the FPC 150 is removed from the flexible-substrate support jig 101, first, the removing member 2531 is moved by a removing-member moving apparatus 2532 from the standby position 2534 to a contact position 2535, as shown in FIG. 13, where the removing member 2531 comes into contact with the FPC 150.

In the removing member 2531, depressions 2536 for containing electronic components 130 are provided in advance so as to correspond to the electronic components 130 mounted on the component mounting/placement surface 150a of the FPC 150. Therefore, the removing member 2531 can come into close contact with the entire surface of the component mounting/placement surface 150a. After the removing member 2531 has come into contact with the FPC 150, a suction apparatus 2533 performs a suction operation, whereby the removing member 2531 can suck the FPC 150.

Figure 13:
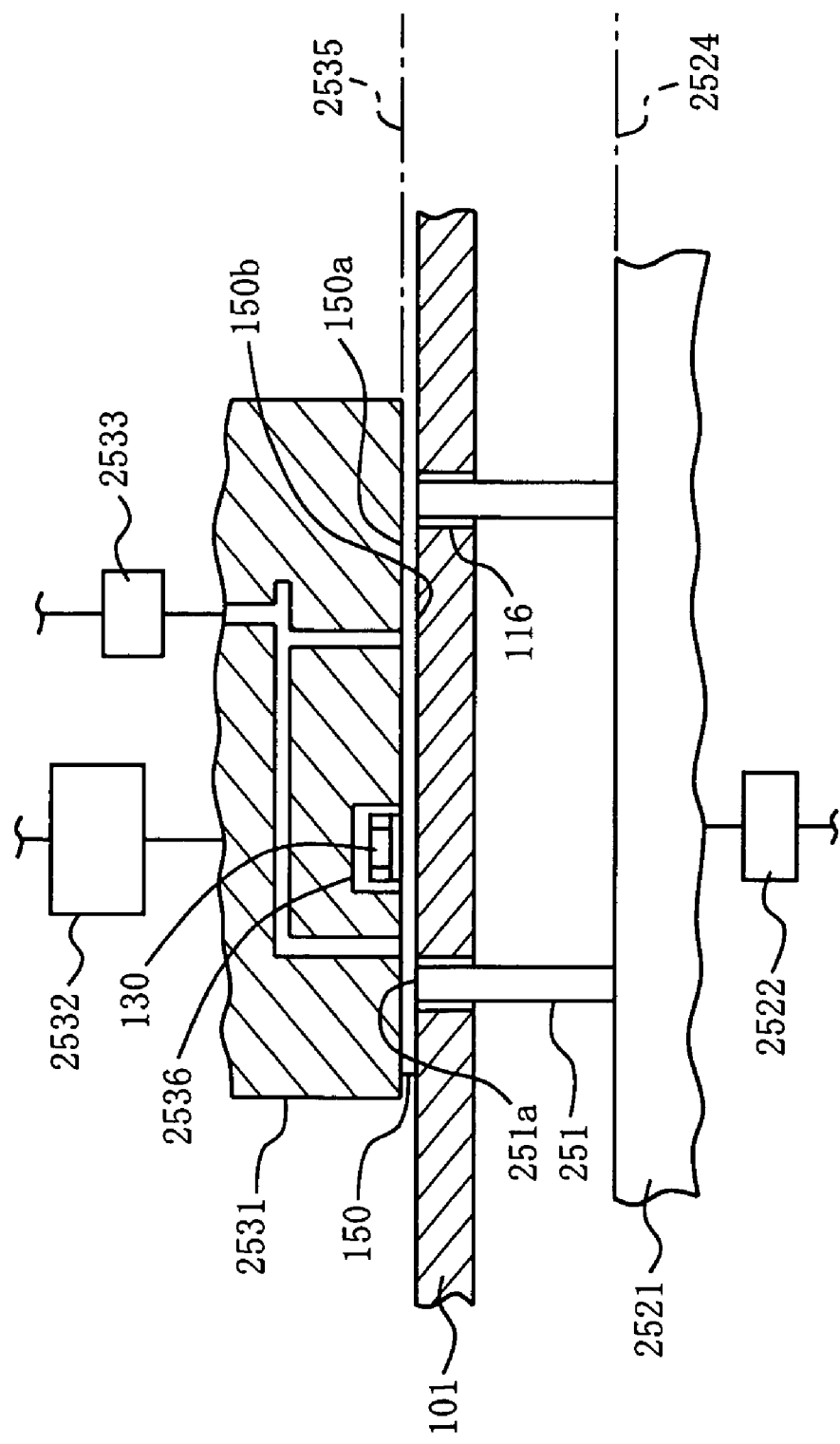
FIG. 13 is a diagram for explaining an operation of removing a substrate performed by the substrate removing apparatus shown in FIG. 12.

Meanwhile, as shown in FIG. 13, a pin elevation apparatus 2522 is activated to move the pin mounting plate 2521 from the down position 2523 to a pin contact position 2524 where ends 251a of the removing pins 251 come into contact with a back side 150b of the FPC 150 temporarily adhered to the flexible-substrate support jig 101. By this operation, the removing pins 251 go into the through holes 116, and the ends 251a come into contact with the back side 150b.

Figure 14:
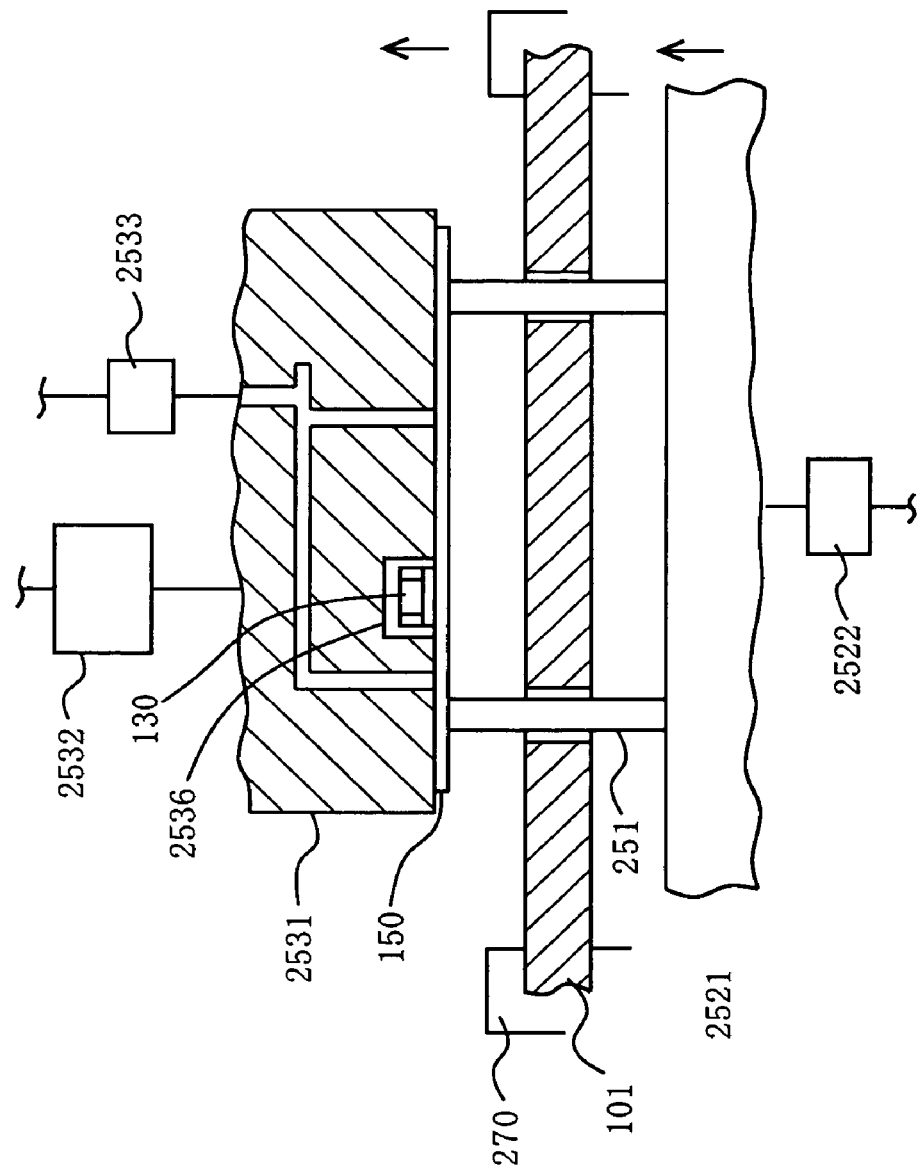
FIG. 14 is a diagram for explaining the operation of removing a substrate performed by the substrate removing apparatus shown in FIG. 12.

Subsequently, the pin elevation apparatus 2522 and the removing-member moving apparatus 2532 are activated synchronously so that the pin mounting plate 2521 and the removing member 2531 move simultaneously in the same direction at the same speed. Specifically, as shown in FIG. 14, the pin mounting plate 2521 is further elevated from the pin contact position 2524, and the removing pins 251 penetrate through the flexible-substrate support jig 101.

On the other hand, the removing member 2531 moves in the direction of the standby position 2534 from the contact position 2535. Therefore, the FPC 150 being sucked to the removing member 2531 is pushed up by the removing pins 251 from the side of the back side 150b, whereby the entire surface of the back side 150b is peeled almost all together off the adhesive material 111 of the flexible-substrate support jig 101. After the peeling, the removing member 2531 returns to the standby position 2534 while the FPC 150 is still being sucked to the removing member 2531 and supported by the removing pins 251.

After the removing member 2531 has returned to the standby position 2534, the pin elevation apparatus 2522 is driven so that the pin mounting plate 2521 returns to the down position 2523. Then, the flexible-substrate support jig 101 from which the FPC 150 has been removed, is carried in the X direction by the carrying apparatus 270 and carried in the subsequent cleaning apparatus 260. The FPC 150, on the other hand, is carried by the removing member 2531 to an FPC storage section and stored. After the storing operation, the removing member 2531 is positioned in the standby position 2534.

In the substrate removing apparatus 250, as described above, the FPC 150 temporarily adhered to the flexible-substrate support jig 101 is pushed up by the removing pins 251 from the side of the back side 150b of the FPC 150 while the entire surface of the component mounting/placement surface 150a is being sucked to the removing member 2531, whereby the entire surface of the back side 150b is peeled almost all together off the adhesive material 111. Therefore, it is possible to prevent the FPC 150 from curing, or the lead section 151 of the FPC 150 from bending, for example.

In the cleaning apparatus 260, cleaning is performed on the adhesive region 112 in such a manner that while the flexible-substrate support jig 101 having been carried by the carrying apparatus 270 in the X direction is being carried, a press roller 2634 is pressed against the flexible-substrate support jig 101 and at the same time a cleaning cloth 261 is wound onto a winding-side roll 2632 and a detergent is supplied by a detergent supply apparatus 2636 to a cleaning cloth 261 just before being pressed by the press roller 2634 against the adhesive region 112.

By performing the cleaning operation, the dust attached to the surface of an adhesive material 111 having adhesiveness can be removed. Thus, next time when another FPC 150 is temporarily adhered to the adhesive material 111, the problem of reduction in temporary adhesiveness of the FPC 150 caused by dust does not occur.

The flexible-substrate support jig 101 thus cleaned is again supplied to the adhesion apparatus 210 so as to be used as a support jig for an FPC 150 as described above.

In the present embodiment, as described above, the cleaning apparatus 260 is installed in the section of the final process after the substrate removing apparatus 250. This configuration is preferable in view of the fact that temporary adhesion of an FPC 150 can be performed on an adhesive material 111 in its cleaniest state; however, the installation position of the cleaning apparatus 260 is not limited to the one described in the present embodiment. Namely, the cleaning apparatus 260 may be installed between any processes as long as the installation position is in such a condition that an FPC 150 is not temporarily being adhered to a flexible-substrate support jig 101.

Although in the present embodiment cleaning of an adhesive material 111 by the cleaning apparatus 260 is performed every time an FPC 150 is removed from an adhesive material 111, the cleaning process is not limited thereto. For example, the cleaning may be performed once every predetermined number of times, or only when the dirt on an adhesive material 111 reaches to a predetermined level which may be measured by a dirt detection apparatus additionally provided.

As has been described above, according to the circuit board production apparatus 201 of the present embodiment, even if the substrate has flexibility and low-stiffness (e.g., FPCs 150), the substrate can be carried stably with the use of the flexible-substrate support jig 101, and also the application of a bonding material 120 and the mounting and bonding of electronic components 130 can be performed stably.

Further, in the heating apparatus 240, the heating table 241 is provided to heat a flexible-substrate support jig 101 having an FPC 150 temporarily adhered thereto in such a manner that the flexible-substrate support jig 101 is placed and brought into contact with the heating table 241. This makes it possible to make the device configuration more compact, as compared to the case of using a conventional reflow furnace in which a substrate is heated in a heated furnace atmosphere. Therefore, the heating apparatus 240 is more advantageous than conventional reflow furnaces in terms of space, cost, and the like.

Although in the present embodiment, as described above, cream solder is used as an exemplary bonding material 120 for bonding electronic components 130 to an FPC 150, the bonding material 120 is not limited thereto. It is also possible to use publicly-known materials, such as conductive pastes containing thermosetting resin, for example. Further, although in the present embodiment a bonding material 120 is provided on an FPC 150 by a printing method performed by the bonding-material printing apparatus 220, as described above, the method is not limited thereto. For example, publicly-known methods, such as a coating method that employs a dispenser or a transfer method, may be employed.

Although in the present embodiment, as described above, an FPC 150 is removed from a flexible-substrate support jig 101 in such a manner that the peeling driving apparatus 252 included in the substrate removing apparatus 250 allows the removing pins 251 to go into through holes 116 provided in the flexible-substrate support jig 101, the method of removing an FPC 150 is not limited thereto. For example, gas may be supplied to through holes 116 so that an FPC 150 can be removed by the pressure of the gas. Therefore, the through holes 116 can be defined as holes not only for allowing the removing pins 251 to go into, but also for peeling an FPC 150 off a flexible-substrate support jig 101.

While the invention has been described in detail, the foregoing description is in all aspects illustrative and not restrictive. It is understood that numerous other modifications and variations can be devised without departing from the scope of the invention.

What is claimed is:

1. A substrate support jig for removably holding a substrate when mounting electronic components on the substrate, the substrate support jig comprising:
    a base member having a first surface and a second surface; and
    an adhesive material being made of a material able to adhere to the substrate, the adhesive material being provided on the first surface of the base member,
    wherein a first region which is provided with the adhesive material and a second region which is not provided with the adhesive material are provided on the first surface of the base member,
    wherein the second region is enclosed by the first region, and
    wherein the base member is provided with through holes penetrating through the second region from the first surface of the base member to the second surface of the base member for removing the substrate from the base member.

2. The substrate support jig according to claim 1, wherein the substrate comprises lead sections and a non-lead section,
    wherein the lead sections are for connecting with external terminals,
    wherein the non-lead section is a section of the substrate other than the lead sections, and
    wherein the adhesive material is formed in a shape such that the adhesive material is able to adhere to the non-lead section of the substrate.

3. The substrate support jig according to claim 1, wherein a distance between the first surface of the base member and the second surface of the base member is from a range of 2 mm to 4 mm.

4. The substrate support jig according to claim 1, wherein a hardness of the adhesive material is from a range of 20 to 50 Hs.

5. The substrate support jig according to claim 1, wherein the adhesive material has a heat resistance that withstands temperatures exceeding a heating temperature at which a bonding material melts, the bonding material bonding the electronic components to the substrate.

6. The substrate support jig according to claim 5, wherein the temperatures exceeding the heating temperature are 185° C. and higher.

7. The substrate support jig according to claim 1, wherein the adhesive material has abrasion resistance.

8. The substrate support jig according to claim 1, wherein the base member has positioning marks provided thereon for positioning the substrate.

9. The substrate support jig according to claim 8,
    wherein the positioning marks are disposed in at least a first corner region and a second corner region of the base member, and
    wherein the first and second corner regions of the base member are located outside of a region of the base member on which the substrate is disposed.

10. The substrate support jig according to claim 1,
    wherein the first region is formed in a depression of the base member, and
    wherein the adhesive material is provided inside of the depression.

11. The substrate support jig according to claim 10, wherein a depth of the depression is from a range of 0.1 mm to 0.5 mm.

12. The substrate support jig according to claim 1, wherein the second region is enclosed by the first region in an island-like manner.

13. The substrate support jig according to claim 1, wherein the adhesive material has a thickness from a range of 0.1 mm to 0.6 mm.

14. The substrate support jig according to claim 1, wherein the adhesive material protrudes above the second region by approximately 0.1 mm.

15. A circuit board production apparatus for producing an electronic circuit board by mounting electronic components on a substrate, the apparatus comprising:
    an adhesion apparatus for pressing the substrate against a substrate support jig for temporary adhesion;
    a bonding-material supply apparatus for applying a bonding material for bonding the electronic components to the temporarily adhered substrate;
    a component mounting apparatus for mounting the electronic components to the applied bonding material;
    a heating apparatus for heating the bonding material having the electronic components mounted thereto, to bond the electronic components to the substrate; and
    a substrate removing apparatus for peeling the substrate having the electronic components bonded thereto off the substrate support jig, wherein
    the substrate support jig includes:
    a base member having a first surface and a second surface; and
    an adhesive material being made of a material able to adhere to the substrate, the adhesive material being provided on the first surface of the base member,
    wherein a first region which is provided with the adhesive material and a second region which is not provided with the adhesive material are provided on the first surface of the base member,
    wherein the second region is enclosed by the first region, and
    wherein the base member is provided with through holes penetrating through the second region from the first surface of the base member to the second surface of the base member for removing the substrate from the base member.

16. The circuit board production apparatus according to claim 15, wherein the heating apparatus includes a heating table for heating the base member by bringing the heating table into contact with the second surface.

17. The circuit board production apparatus according to claim 15, wherein the base member has positioning marks provided thereon for positioning, and the substrate has substrate-side marks provided thereon for positioning, and the adhesion apparatus includes:
a holding member for sucking and holding an entire surface or substantially entire surface of the substrate;
a holding and pressing apparatus for pressing the sucked and held substrate against the first region for temporary adhesion;
a recognition apparatus for recognizing the positioning marks and the substrate-side marks; and
a control apparatus for controlling an operation of the holding and pressing apparatus based on a result of the recognition.

18. The circuit board production apparatus according to claim 15, wherein
the bonding-material supply apparatus includes:
a jig holding apparatus for holding and positioning the substrate support jig having the substrate temporarily adhered thereto; and
an application apparatus for placing a screen mask on the positioned substrate and applying the bonding material to the positioned substrate Through the screen mask.

19. The circuit board production apparatus according to claim 15, wherein
the component mounting apparatus includes:
a component supply apparatus for supplying the electronic components to be mounted on the temporary adhered substrate; and
a component holding apparatus for holding and mounting the supplied electronic components on the substrate.

20. The circuit board production apparatus according to claim 15, wherein
the substrate removing apparatus includes:
removing pins placed so as to go into the through holes from the second surface and protrude from the first surface; and
a peeling driving apparatus for moving the removing pins through the through holes relatively to the substrate support jig.

21. The circuit board production apparatus according to claim 20, wherein
the substrate removing apparatus further includes:
a substrate holding apparatus for holding the substrate having been peeled off the substrate support jig by movement of the removing pins.

22. The circuit board production apparatus according to claim 20, wherein the removing pins are placed in an area corresponding to a no-component mounted portion of the temporarily adhered substrate where the electronic components are not being mounted.

23. The circuit board production apparatus according to claim 15, further comprising:
a cleaning apparatus for cleaning the adhesive material of the substrate support jig off which the substrate has been peeled.

24. The circuit board production apparatus according to claim 23, wherein
the cleaning apparatus includes:
a first-region cleaning cloth for removing dust from the first region; and
a moving apparatus for moving the cleaning cloth relatively to the substrate support jig while bringing the cleaning cloth into contact with the adhesive material.

25. An adhesion apparatus for allowing a substrate to temporarily adhere to a substrate support jig, the adhesion apparatus comprising:
a holding member for sucking and holding an entire surface or substantially entire surface of the substrate;
a holding and pressing apparatus for pressing the held substrate against the substrate support jig for temporary adhesion;
a recognition apparatus for recognizing positioning marks and substrate-side marks when the holding and pressing apparatus allows the substrate to temporarily adhere to the base member, the positioning marks being provided on the substrate support jig and used to position the substrate, and the substrate-side marks being provided on the substrate and used to position the substrate; and
a control apparatus for controlling an operation of the holding and pressing apparatus based on a result of the recognition,
wherein the substrate support jig includes:
a base member having a first surface and a second surface; and
an adhesive material being made of a material able to adhere to the substrate, the adhesive material being provided on the first surface of the base member,
wherein a first region which is provided with the adhesive material and a second region which is not provided with the adhesive material are provided on the first surface of the base member,
wherein the second region is enclosed by the first region,
wherein the base member is provided with through holes penetrating through the second region from the first surface of the base member to the second surface of the base member for removing the substrate from the base member, and
wherein the base member has positioning marks provided thereon for positioning, and the substrate has substrate-side marks provided thereon for positioning.

26. A circuit board production apparatus for producing an electronic circuit board by mounting electronic components on a substrate, the apparatus comprising:
an adhesion apparatus for allowing the substrate to temporarily adhere to a substrate support jig; and
a substrate removing apparatus for peeling the temporarily adhered substrate off the substrate support jig,
wherein the substrate support jig includes:
a base member having a first surface and a second surface; and
an adhesive material being made of a material able to adhere to the substrate, the adhesive material being provided on the first surface of the base member,
wherein a first region which is provided with the adhesive material and a second region which is not provided with the adhesive material are provided on the first surface of the base member
wherein the second region is enclosed by the first region
wherein the base member is provided with through holes penetrating through the second region from the first surface of the base member to the second surface of the base member for removing the substrate from the base member, and
wherein the substrate removing apparatus includes:
removing pins placed so as to go into the through boles from the second surface;
a peeling driving apparatus for moving the removing pins through the through holes relatively to the substrate support jig so as to push the temporarily adhered substrate; and
a substrate holding apparatus for holding the substrate having been peeled off the substrate support jig by movement of the removing pins.

* * * * *